(12) United States Patent
Hensch et al.

(10) Patent No.: US 11,342,467 B2
(45) Date of Patent: May 24, 2022

(54) ELECTRONIC CIRCUIT WITH A TRANSISTOR DEVICE, A LEVEL SHIFTER AND A DRIVE CIRCUIT

(71) Applicant: Infineon Technologies Dresden GmbH & Co. KG, Dresden (DE)

(72) Inventors: Richard Hensch, Dresden (DE); Franz Stueckler, St.Stefan (AT); Stefan Tegen, Dresden (DE); Rolf Weis, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 17/506,272

(22) Filed: Oct. 20, 2021

(65) Prior Publication Data

US 2022/0037536 A1 Feb. 3, 2022

Related U.S. Application Data

(63) Continuation of application No. 16/531,460, filed on Aug. 5, 2019, now Pat. No. 11,183,598.

(30) Foreign Application Priority Data

Aug. 6, 2018 (DE) .......................... 102018119098.0

(51) Int. Cl.
*H01L 29/786* (2006.01)
*H01L 29/36* (2006.01)
*H01L 29/10* (2006.01)

(52) U.S. Cl.
CPC .... *H01L 29/78696* (2013.01); *H01L 29/1037* (2013.01); *H01L 29/36* (2013.01); *H01L 29/78639* (2013.01)

(58) Field of Classification Search
CPC . H01L 27/0207; H01L 29/1037; H01L 29/36; H01L 29/78639; H01L 29/78696
See application file for complete search history.

(56) References Cited

U.S. PATENT DOCUMENTS

| 5,985,708 A | 11/1999 | Nakagawa et al. | |
|---|---|---|---|
| 2002/0175661 A1* | 11/2002 | Wheeler | H02M 3/28 323/282 |
| 2011/0006361 A1 | 1/2011 | Darwish et al. | |
| 2013/0093508 A1 | 4/2013 | Sakamoto et al. | |
| 2014/0015592 A1 | 1/2014 | Weis | |
| 2015/0008539 A1 | 1/2015 | Kanda et al. | |

(Continued)

FOREIGN PATENT DOCUMENTS

DE 19710487 A1 9/1997

*Primary Examiner* — Allan R Wilson
(74) *Attorney, Agent, or Firm* — Murphy, Bilak & Homiller, PLLC

(57) ABSTRACT

An electronic circuit is disclosed. The electronic circuit includes: a first transistor device integrated in an inner region of a first semiconductor body; a level shifter integrated in a level shifter region of the first semiconductor body, the level shifter region located in an edge region surrounding the inner region of the semiconductor body; and a drive circuit integrated in a drive circuit region in the edge region of the first semiconductor body, the drive circuit configured to receive a first input signal from a first input and drive the first transistor device based on the first input signal, the drive circuit region arranged closer to the inner region than the level shifter region.

25 Claims, 15 Drawing Sheets

(56) References Cited

U.S. PATENT DOCUMENTS

| | | |
|---|---|---|
| 2015/0014783 A1 | 1/2015 | Imai et al. |
| 2016/0006427 A1 | 1/2016 | Jonishi et al. |
| 2016/0308534 A1 | 10/2016 | Yamaji |
| 2016/0336442 A1 | 11/2016 | Nielsen et al. |
| 2017/0302178 A1 | 10/2017 | Bandyopadhyay et al. |
| 2021/0295923 A1* | 9/2021 | Rhie ................ G11C 16/06 |

* cited by examiner

ELECTRONIC CIRCUIT WITH A TRANSISTOR DEVICE, A LEVEL SHIFTER AND A DRIVE CIRCUIT

TECHNICAL FIELD

This disclosure in general relates to an electronic circuit, in particular an electronic circuit that includes at least one transistor device and a level shifter.

BACKGROUND

Various types of electronic circuits include a half-bridge circuit with a first transistor device and a second transistor device that have their load paths connected in series. Each of these two transistor devices switches on and off dependent on a respective drive signal received at a respective control node. In a MOSFET (Metal Oxide Semiconductor Field-Effect Transistor), for example, the drive signal is a drive voltage received between a gate node, which forms the control node of the MOSFET, and a source node.

A half-bridge circuit may receive control signals that govern switching on and switching off the two transistor devices from a control circuit, such as a microcontroller, or the like. In some types of half-bridge circuits, the first transistor device directly receives the respective control signal or a drive circuit coupled to the first transistor device directly receives the respective control signal, while a drive circuit connected to the second transistor device receives the respective control signal via a level shifter from the control circuit.

There is a need to implement the first transistor device, the level shifter and the drive circuit configured to drive the second transistor device in a space saving fashion.

SUMMARY

One example relates to an electronic circuit. The electronic circuit includes a first transistor device integrated in an inner region of a first semiconductor body, and a first drive circuit integrated in a first drive circuit region of the semiconductor body, configured to be connected to a level shifter and configured to drive a second transistor device. The first drive circuit region is located in an edge region surrounding the inner region of the semiconductor body.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
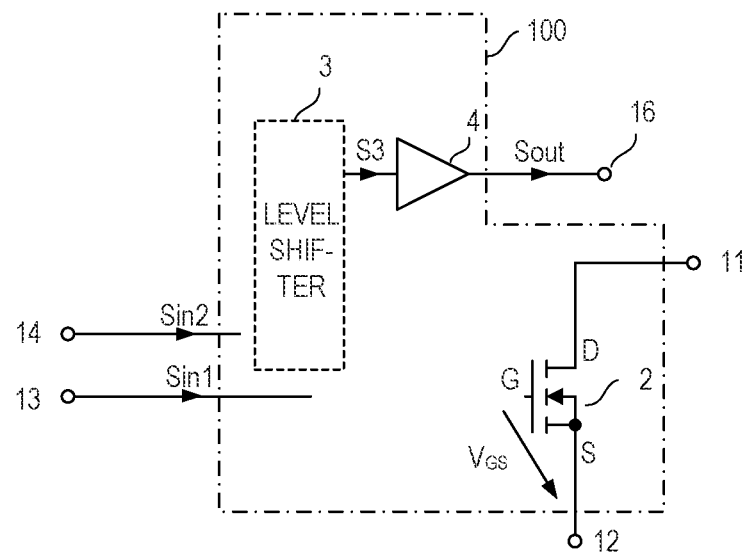
FIG. 1 shows a circuit diagram of one example of an electronic circuit that includes a first transistor device, an optional level shifter and a drive circuit configured to drive a second transistor device.
Figure 2A:
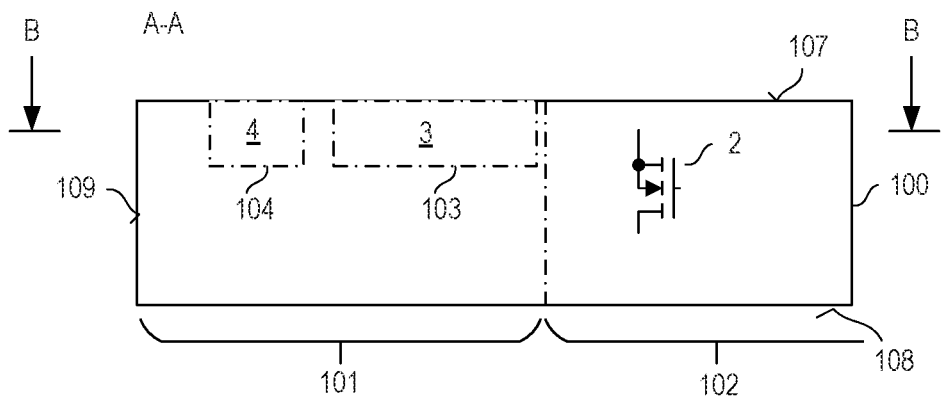
FIG. 2A schematically illustrates a vertical cross-sectional view of one section of a semiconductor body in which the first transistor device, the optional level shifter and the drive circuit are integrated.
Figure 2B:
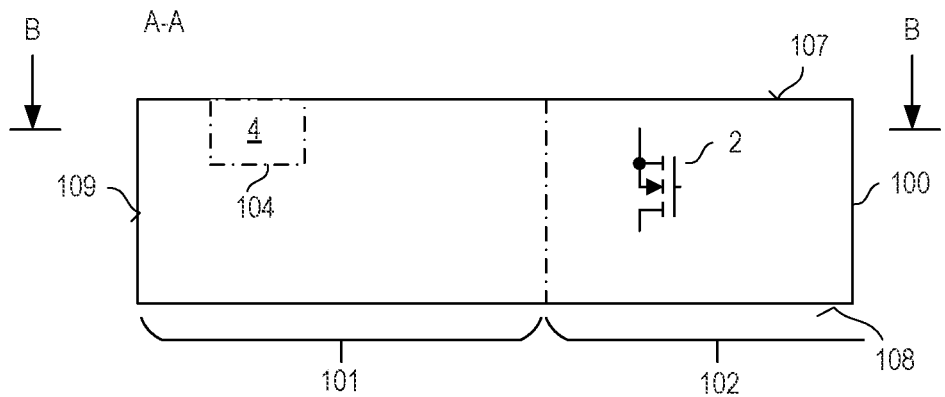
FIG. 2B schematically illustrates a vertical cross-sectional view of one section of a semiconductor body in which the first transistor device, and the drive circuit are integrated.
Figure 3:
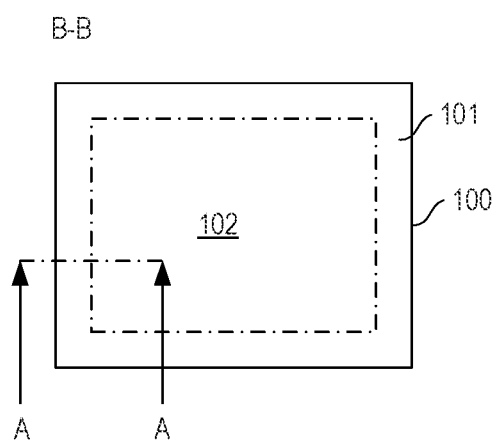
FIG. 3 schematically illustrates a top view of the semiconductor body.

FIG. 1 shows a circuit diagram of an electronic circuit according to one example, FIGS. 2A and 2B each schematically illustrates a vertical cross-sectional view of one section of a semiconductor body 100 in which the electronic circuit is integrated, and FIG. 3 schematically illustrates a top view of the semiconductor body 100. Referring to FIG. 1, the electronic circuit includes a first transistor device 2 and a drive circuit 4. The drive circuit 4 is configured to be connected to a level shifter 3 and is configured to drive a second transistor device (not shown in FIG. 1).

The level shifter 3 (that is illustrated in dashed lines in FIG. 1) is optional in the electronic circuit and, therefore, the semiconductor body 100. That is, the level shifter 3 may be included in the electronic circuit and integrated in the semiconductor body 100 or may be an external circuit that is not integrated in the semiconductor body. FIG. 2A illustrates a vertical cross-sectional view of a semiconductor body 100 in which the level shifter is integrated, and FIG. 2B illustrates a vertical cross-sectional view of a semiconductor body 100 in which the level shifter is not integrated. Everything, except for the level shifter 3, explained in the following with regard to the semiconductor body 100 shown in FIG. 2A applies to the semiconductor body shown in FIG. 2B accordingly.

Referring to FIGS. 2A and 2B, the semiconductor body 100 includes a first (main) surface 107, a second (main) surface 108 opposite the first surface 107, and a side surface 109 that extends between the first surface 107 and the second surface 108. Each of FIGS. 2A and 2B shows a vertical cross-sectional view of one section of the semiconductor body 100 in a vertical section plane A-A. This vertical section plane A-A is a plane perpendicular to each of the first and second surfaces 107, 108 of the semiconductor body 100. FIG. 3 shows a horizontal cross-sectional view of the semiconductor body 100 in a horizontal section plane B-B in order to illustrate a position of an inner region 102 and an edge region 101 in the semiconductor body 100. The horizontal section plane B-B is a plane parallel to each of the first and second surfaces 107, 108. Referring to FIGS. 2A, 2B and 3, the edge region 101 of the semiconductor body 100 is arranged between the inner region 102 and the side surface 109 of the semiconductor body 100 and the edge region 101 surrounds the inner region 102 in horizontal planes of the semiconductor body 100.

It should be noted that FIGS. 2A, 2B and 3 only schematically illustrate the semiconductor body 100. This means that conducting layers or passivation layers that may be formed on the first surface 107 and/or the second surface 108 are not shown in these figures. Further, in the example illustrated in FIG. 2, angles between the side surface 109 and the first surface 107 and the second surface 108 are about 90°. This, however, is only an example. According to another example (not shown) the side surface 109 is beveled relative to the first and second surfaces 107, 108.

The semiconductor body 100 may include a conventional (monocrystalline) semiconductor material such as, for example, silicon (Si), silicon carbide (SiC), gallium arsenide (GaAs), gallium nitride (GaN), or the like.

Referring to FIGS. 2A and 2B, the first transistor device 2 is integrated in the inner region 102 of the semiconductor body 100. This integration is only schematically illustrated in FIGS. 2A and 2B. A more detailed example is explained herein further below.

Referring to FIGS. 2A and 2B, the semiconductor body 100 further includes, in the edge region 101 of the semiconductor body 100, a first drive circuit region 104. Optionally, referring to FIG. 2B the semiconductor body 100 further includes a level shifter region 103 in the edge region 101 of the semiconductor, wherein the level shifter region 103 is arranged closer to the inner region 102 than the first drive circuit region 104. More specifically, in a horizontal direction of the semiconductor body 100, the level shifter region 103 is arranged between the first drive circuit region 104 and the inner region 102 and the first drive circuit region 104 is arranged between the level shifter region 103 and the first side surface 109 of the semiconductor body 100. The "horizontal direction" is a direction parallel to the first and second surfaces 107, 108 of the semiconductor body 100. The level shifter 3 is integrated in the level shifter region 103 and the drive circuit 4 is integrated in the first drive circuit region 104. This, however, is only schematically illustrated in FIGS. 2A and 2B. Examples are explained herein further below.

With regard to the first transistor device 2 being integrated in the inner region 102, the optional level shifter 3 being integrated in the level shifter region 103, and the drive circuit 4 being integrated in the first drive circuit region 104, "integrated" means that each of the first transistor device 2, the level shifter 3, and the drive circuit 4 includes several doped semiconductor regions that are located in the inner region 102, the level shifter region 103, and the first drive circuit region 104, respectively, of the semiconductor body 100. In addition to these doped semiconductor regions each of the first transistor device 2, the level shifter 3 and the drive circuit 4 may include conductors, electrodes, or the like formed on top of the first and/or the second surface 107, 108 of the semiconductor body 100.

Referring to FIG. 1, the first transistor device 2 includes a control node G, a load path D-S between a first load node S and a second load node D and is configured to switch on or off dependent on a drive voltage $V_{GS}$ received at a drive input. According to one example, the load path D-S is connected between a first output node 11 and a second output node 12 of the electronic circuit, wherein these first and second output nodes are also referred to as first load output node 11 and a second load output node 12 in the following.

According to one example, the first transistor device 2 is a MOSFET (Metal Oxide Semiconductor Field-Effect Transistor). It should be noted that the term MOSFET as used herein denotes any type of field-effect transistor with an insulated gate electrode (often referred to as IGFET) irrespective of whether the gate electrode includes a metal or another type of electrically conducting material, and irrespective of whether the gate dielectric includes an oxide or another type of dielectrically insulating material. The circuit symbol of the first transistor device 2 shown in FIG. 1 represents an n-type enhancement MOSFET. This, however, is just for illustration purposes. Any other type of MOSFET such as a p-type enhancement MOSFET, a p-type depletion MOSFET, an n-type depletion MOSFET, or any other type of field-effect transistor such as an IGBT (Insulated Gate Bipolar Transistor) or a JFET (Junction Field-Effect Transistor) may be used as well.

In a MOSFET, the control node G is also referred to as gate node, the first load node S is also referred to as source node, the second load node D is also referred to as drain node, and the drive voltage $V_{GS}$ is also referred to as gate-source voltage. Although the first transistor device 2 shown in FIG. 1 is not restricted to be implemented as a MOSFET, the terms gate node G, source node S and drain node D will be used in the following to denote the control node, the first load node and the second load node, respectively. Further, although in the MOSFET illustrated in FIG. 1 the drive input receiving the drive voltage $V_{GS}$ is formed by the gate node G and the source node S, this is only an example. According to a further example (not illustrated), the drive input is formed by the gate node and an auxiliary source node that is different from the source node. According to yet another example, the drive input is formed by the gate node and by a circuit node that is connected to the source node S via a (current measurement) resistor.

Referring to the above, the first transistor device 2 switches on or off dependent on the drive voltage $V_{GS}$. According to one example, this drive voltage $V_{GS}$ is dependent on a first input signal Sin1 received at a first input 13 of the electronic circuit so that the first transistor device 2 switches on or off dependent on the first input signal Sin1. Examples of how the drive voltage $V_{GS}$ may be generated based on the first input signal Sin1 are explained herein further below.

The drive circuit 4 is configured to generate an output signal Sout at a further output 16 of the electronic circuit based on a level shifter signal S3 received from the level shifter 3. Referring to the above, the level shifter 3 may be part of the electronic circuit and integrated in the semiconductor body 100, or may be an external circuit. This further output 16 is also referred to as drive output in the following. According to one example, the level shifter 3 is configured to generate the level shifter signal S3 based on a second input signal Sin2, wherein the second input signal Sin2 is received at a second input 14 of the electronic circuit when the level shifter 3 is part of the electronic circuit. When the level shifter 3 is an external circuit, the electronic circuit receives the level shifter signal S3 instead of the second input signal Sin2. In each case, the output signal Sout at the further output 16 is generated based on the second input signal Sin2. According to one example, the output signal Sout is a voltage at the drive output 16 that is referenced to the first load output node 11.

Figure 4:
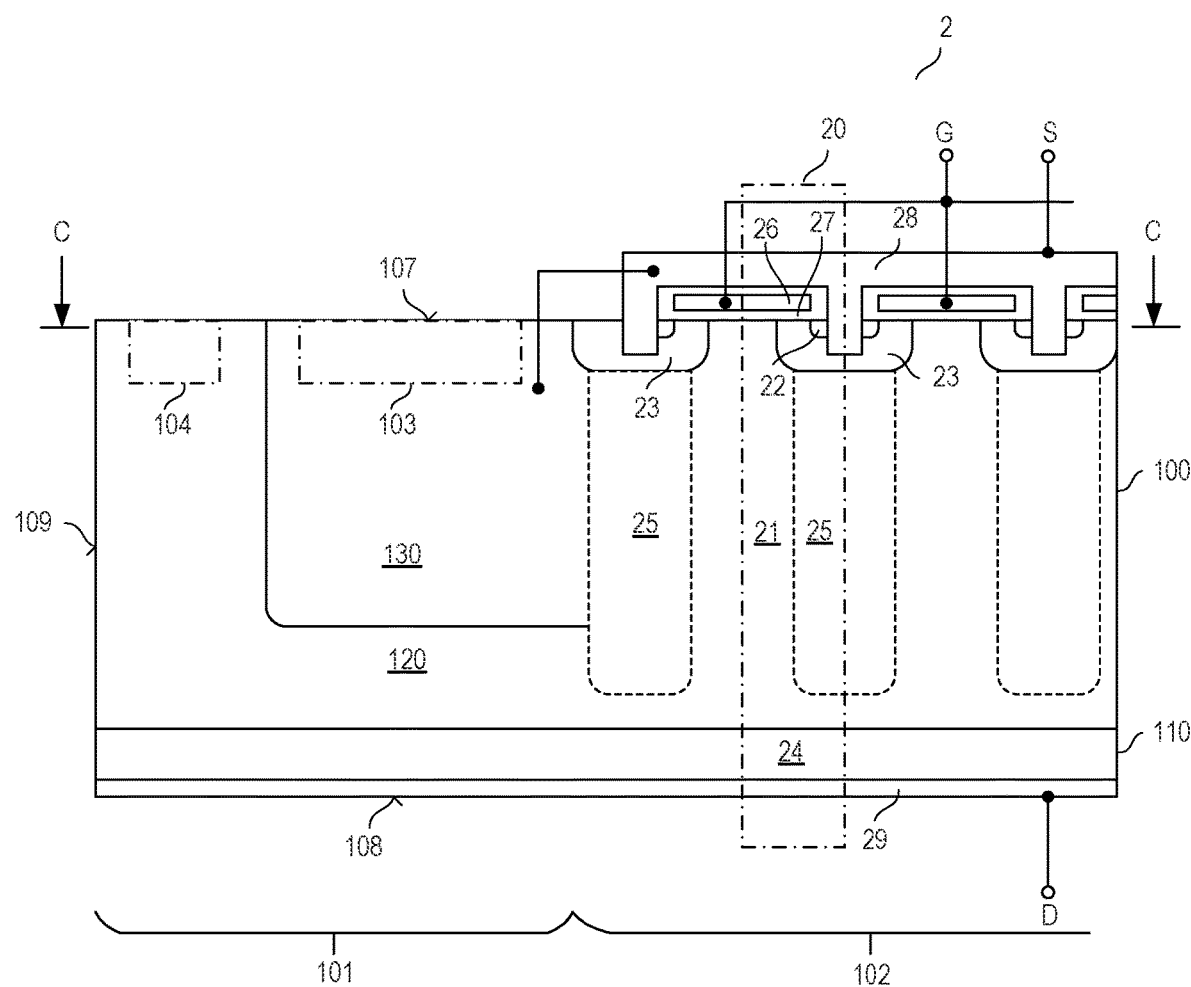
FIG. 4 schematically illustrates the vertical cross-sectional view shown in FIG. 2 in greater detail.

FIG. 4 shows a vertical cross-sectional view of the semiconductor body 100 in the section plane A-A explained above and illustrates one example of how the first transistor device 2 may be implemented in the inner region 102. In this example, the first transistor device 2 is a MOSFET that includes a plurality of transistor cells 20. Each of these transistor cells 20 includes a drift region 21 of a first doping type (conductivity type), a source region 22 of the first doping type and a body region 23 of a second doping type (conductivity type) complementary to the first doping type, wherein the body region 23 is arranged between the drift region 21 and the source region 22. Further, each transistor cell 20 includes a gate electrode 26 adjacent the body region 23 and dielectrically insulated from the body region 23 by a gate dielectric 27. The gate electrodes 26 of the individual transistor cells 20 are connected to the gate node G or form the gate node G of the first transistor device 2. Further, the source and body regions 22, 23 of the individual transistor cells 20 are connected to a source electrode 28. This source electrode 28 forms the source node S or is connected to a source node S of the first transistor device 1. Each transistor cell 20 further includes a drain region 24 of the first doping type, wherein the drain region 24 is separated from the body region 23 by the drift region 21.

In the example shown in FIG. 4, the first transistor device 2 is a vertical transistor device. The transistor cells 20 of this vertical transistor device can be referred to as vertical transistor cells. In this type of transistor cells, the source region 22 is spaced apart from the drain region 24 in a vertical direction of the semiconductor body 100, wherein the "vertical direction" is a direction perpendicular to the first surface 107 and the second surface 108. In an on-state (switched-on state) of the transistor device, a current in the drift region 21 essentially flows in the vertical direction of the semiconductor body 100. The first transistor device 1 switches on or off dependent on the drive voltage $V_{GS}$ received between the gate node G and the source node S, wherein the gate electrode 26 dependent on this drive voltage $V_{GS}$ controls a conducting channel in the body region 23 between the source region 22 and the drift region 21. In the example shown in FIG. 4, the gate electrode 26 is a planar gate electrode arranged on top of the first surface 107 of the semiconductor body 100. This, however, is only an example. According to another example (not shown) the gate electrode 26 is a trench electrode arranged in a trench extending from the first surface 107 into the semiconductor body 100.

Referring to FIG. 4, a drain electrode 29 formed on the second surface 108 is connected to the drain region 24. This drain electrode 22 is connected to the drain node D or forms the drain node D of the transistor device 2. According to another example (not shown) the drain electrode is arranged on top of the first surface 107 between the side surface 109 and the drive circuit region 104 and is connected to the drain region 24 via a semiconductor region of the same doping type as the drain region and extends in a vertical direction from the drain region 24 to the drain electrode. In this example, the drain region can be arranged on an electrically insulation carrier or on a semiconductor substrate of a doping type complementary to the doping type of the drain region 24.

In the first transistor device shown in FIG. 4, the transistor cells 20 are connected in parallel in that the gate electrodes 26 of the individual transistor cells 20 are connected to the gate node G, the source and body region 22, 23 of the transistor cells 20 are connected to the source node S, and the drain regions 24 are connected to the drain node D. In the example shown in FIG. 4, the drain regions 24 of the individual transistor cells 20 are formed by one doped region 110 that adjoins the second surface 108 and is formed in the inner region 102 and the edge region 101 of the semiconductor body 100. This doped region 110 may be formed by a semiconductor substrate, wherein the other doped regions explained above may be formed in an epitaxial layer formed on the substrate.

The first transistor device 2 may be implemented as an n-type transistor device or as a p-type transistor device. In a n-type transistor device, the regions of the first doping type are n-type (n-doped) semiconductor regions and the regions of the second doping type are p-type (p-doped) regions. In a p-type transistor device, the regions of the first doping type are p-type regions and the region of the second doping type are n-type regions. Further, the transistor device can be implemented as an enhancement device or as a depletion device. In an enhancement device, the body region 23 of the second doping type adjoins the gate dielectric 27. In a depletion device, each of the transistor cells 20 further includes a channel region (not shown in the drawings) in the body region 23, wherein the channel region is of the first doping type, adjoins the gate dielectric 27 and extends from the source region 22 to the drift region 21. An enhancement device is in the on-state when the drive $V_{GS}$ is such that the gate electrode 26 generates an inversion channel in the body region 23 along the gate dielectric 27 and is in the off-state when the inversion channel is interrupted. A depletion device is in the on-state when the channel region of the first doping type along the gate dielectric is not depleted by the gate electrode 26 and is in the off-state when the gate electrode 26 depletes the channel region. The transistor device conducts a current when operated in the on-state and when a drain-source voltage different from zero is applied between the drain node D and the source node S.

According to one example, the first transistor device 2 is implemented as a superjunction device. In this example, each transistor cell 20 further includes a compensation region 25 of the second doping type, wherein the compensation region 25 adjoins the drift region 21 in a direction perpendicular to the current flow direction (that is, in a horizontal direction in the example shown in FIG. 4). Further, the compensation region 25 is electrically connected to the source node S. In the example shown in FIG.

4 this is achieved in that the compensation region 25 adjoins the body region 23. According to one example, the compensation region 25 has a depth in the vertical direction of the semiconductor body 100 that is at least 50% or at least 70% of a distance between the body region 23 and the drain region 24 in the vertical direction.

According to one example, the distance between the body regions 23 and the drain region 24 is between 10 micrometers and 100 micrometers, in particular between 20 micrometers and 60 micrometers. This distance, inter alia, affects the voltage blocking capability of the transistor device. The "voltage blocking capability" is given by the maximum drain-source voltage the transistor device 2 can withstand in the off-state without a voltage breakdown (avalanche breakdown) occurring. Basically, the voltage blocking capability increases as the distance between the body regions 23 and the drain region 24 increases. In a transistor device with a voltage blocking capability of 600 volts (V), for example, this distance is between 40 micrometers (μm) and 50 micrometers.

According to one example, doping concentrations of the drift regions 21 and the compensation regions 25 are selected from a range of between 1E16 (=1·10$^{16}$) cm$^{-3}$ and 5E17 cm$^{-3}$, a doping concentration of the source regions 22 is higher than 1E19 cm$^{-3}$, a doping concentration of the drain regions 24 is higher than 1E19 cm$^{-3}$, and a doping concentration of the body regions 23 is selected from a range of between 1E17 cm$^{-3}$ and 1E18 cm$^{-3}$.

Figure 5:
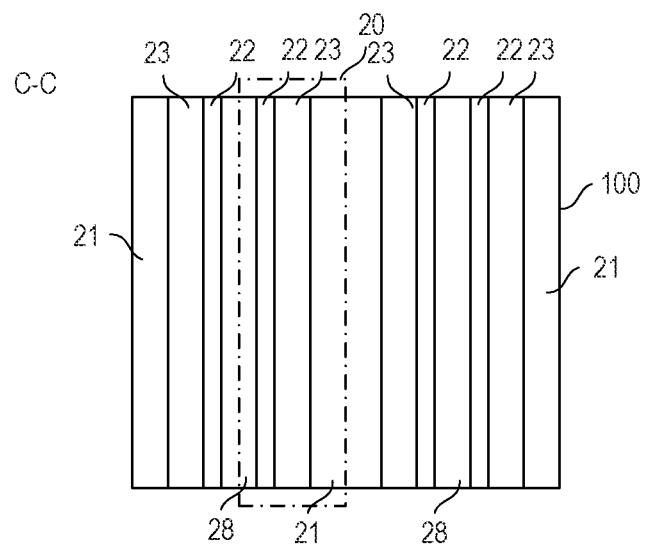
FIG. 5 shows a horizontal cross-sectional view of several transistor cells of the transistor device according to one example.

FIG. 5 shows a horizontal cross-sectional view of one section of the inner region 102 in order to illustrate one example of how the transistor cells may be implemented in the horizontal plane. In this example, the transistor cells 20 are elongated transistor cells. In this case, the source and body regions 22, 23 are elongated semiconductor regions with a length l in a first horizontal direction and a width w in a second horizontal direction perpendicular to the first horizontal direction, wherein the length is significantly greater than the width. According to one example, a ratio l:w between the length and the width is at least 10:1 or at least 100:1.

Figure 6:
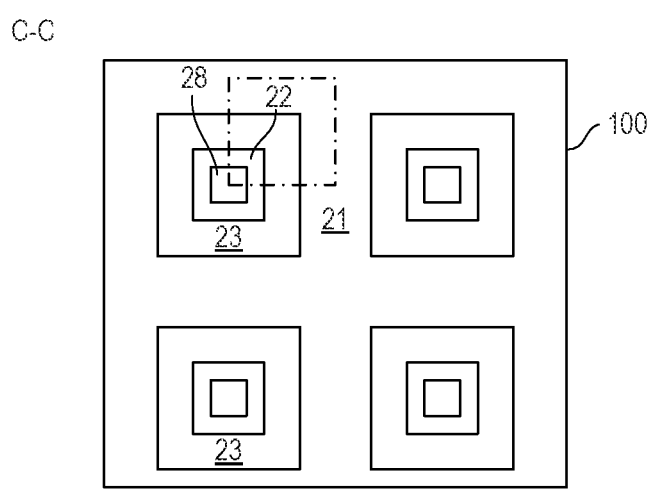
FIG. 6 shows a horizontal cross-sectional view of several transistor cells of the transistor device according to another example.

According to another example, the body regions 23 have a polygonal shape. Referring to FIG. 6, the polygonal shape can be rectangular. This, however, is only an example. The body regions 23 may be implemented with any other type of polygonal shape as well.

In elongated transistor cells 20 of the type illustrated in FIG. 5, the gate electrodes 26 (which are out of view in FIG. 5) can be elongated electrodes formed above the first surface 107. In polygonal transistor cells of the type shown in FIG. 6, the gate electrodes 26 (which are out of view in FIG. 5) of the individual transistor cells 20 can be formed by one grid-shaped electrode formed above the first surface 107.

Referring to FIG. 4, the semiconductor body 100 includes a doped region 120 of the first doping type in the edge region 101. This semiconductor region 120, which is referred to as first region 120 in the following, is connected to the drain node D. Referring to FIG. 4, the first semiconductor region 120 can be connected to the drain node D in that it adjoins the drain region 24. A (maximum) doping concentration of the first region 120 may be equal to the (maximum) doping concentration of the drift regions 21 or may be higher. According to one example, the doping concentration of the first region 120 is at least 1E1 (=10$^1$) times, at least 1E2 times, or even at least 1E3 times the doping concentration of the drift region 21.

Further, in the example illustrated in FIG. 4, the semiconductor body 100 includes a second region 130 of the second doping type. This second region 130 is arranged in the edge region 101, is spaced apart from the side surface 109, forms a pn-junction with the first region 120 and is connected to the source node S. According to one example, the second region 130 adjoins the body region 23 and the optional compensation region 25 of an outermost transistor cell. The "outermost transistor cell" is the transistor cell that is closest to the edge region 101. In the vertical direction (the direction perpendicular to the first surface 107) the second region 130 may extend in the direction of the drain region 24 as far as the optional compensation regions 25. According to another example, as illustrated in FIG. 4, the second region 130 may extend less in the direction of the drain region 24 than the optional compensation regions 25.

According to one example, a maximum doping concentration of the second region 130 is lower than the maximum doping concentration of the drift region 21. According to one example, the doping concentration of the second region 130 is less than 1E-1 (=10$^{-1}$) times, less than 1E-2 times, or even less than 1E-3 times the maximum doping concentration of the drift region 21. According to one example, a doping concentration of the second regions 130 is less than 1E16 cm$^{-3}$.

According to one example, a lateral dimension of the second region 130 is less than a vertical dimension. The "lateral dimension" is the (shortest) dimension in a direction from the side surface 109 towards the inner region 102. The "vertical dimension" is the (shortest) dimension in the vertical direction.

Referring to the above, the first region 120 is coupled to the drain node D and the second region 130 is coupled to the source node. Thus, the pn-junction between the first region 120 and the second region 130 may become reverse biased when the transistor device 2 is in the off-state. According to one example, the doping concentrations of the first region 120 and the second region 130 are adapted to one another such that a voltage blocking capability of the pn-junction formed between the first region 120 and the second region 130 is greater than the voltage blocking capability of the transistor cells 20 in the inner region 102. Thus, when an overvoltage scenario occurs that causes the transistor device 2 to breakdown, the breakdown occurs in the inner region 102. For example, this may be achieved by implementing the first and second regions 120, 130 with a lower doping concentration than the drift region 21. Further, the doping concentration of the first region 120 may be selected such that the first region 120 cannot be completely depleted of charge carriers when the pn-junction between the first region 120 and the second region 130 is reverse biased. In this case a space charge region (depletion region) that occurs when the pn-junction is reverse biased mainly expands in the second region 130. Further, even when the pn-junction is reverse biased, there are sections of the first region 120 along the first surface that have the electrical potential of the drain region 24.

According to one example, the first drive circuit region 104 is embedded in the first semiconductor region 120. The optional level shifter region 103 is embedded in the second region 130.

Figure 7:
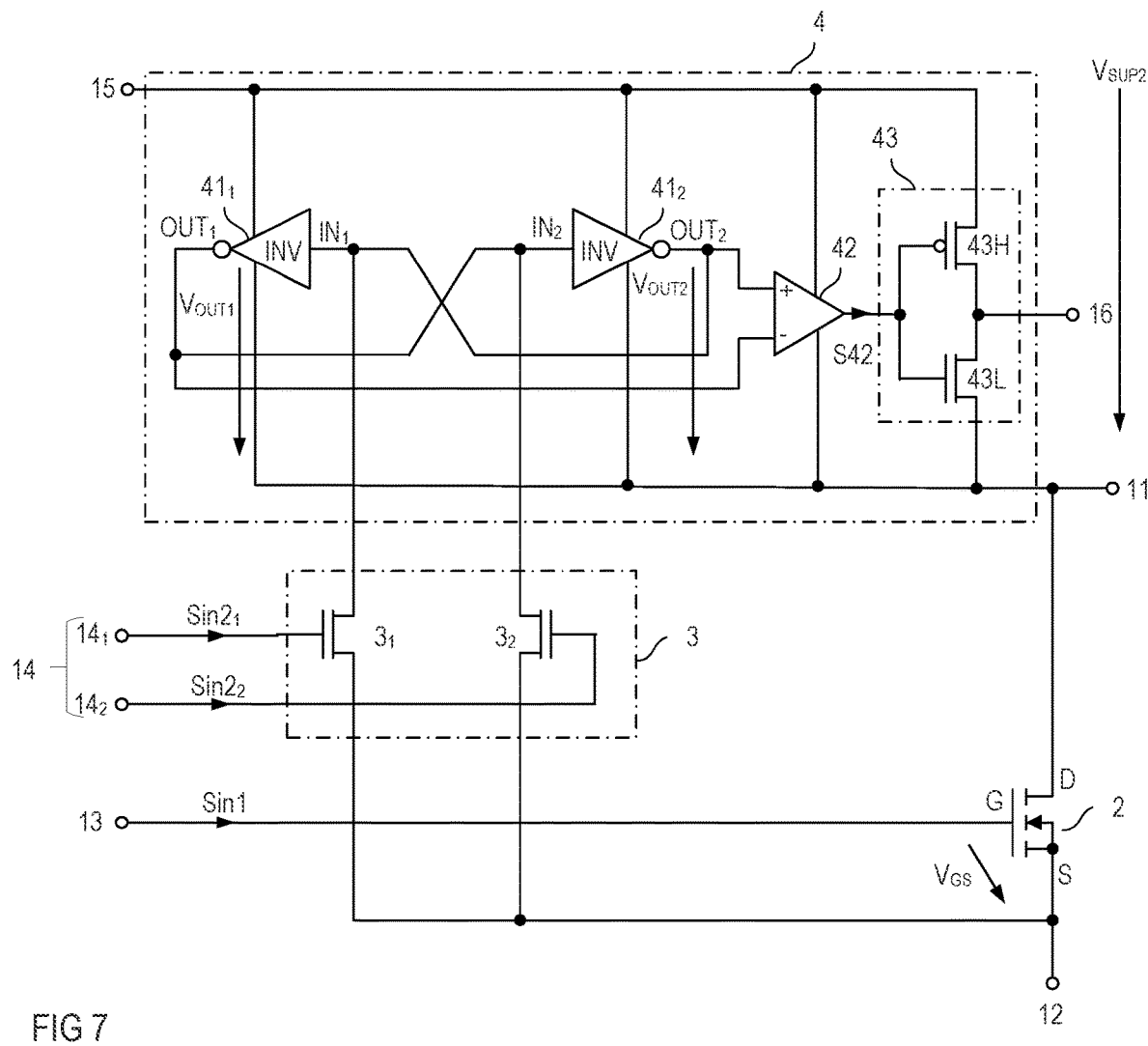
FIG. 7 shows one example of the level shifter and the drive circuit in detail.

FIG. 7 shows an example of the optional level shifter 3 and the drive circuit 4 in greater detail. In this example, the level shifter 3 includes a first level shifter transistor $3_1$ and a second level shifter transistor $3_2$ each having a load path and a control node. Just for the purpose of illustration, the circuit symbols of the level shifter transistors $3_1$, $3_2$ shown in FIG. 7 represent n-type MOSFETs. The load path of the first level shifter transistor $3_1$ is connected between an input IN$_1$ of a first inverter 41$_1$ of the drive circuit 4 and the second load output 12 and the load path of the second level shifter transistor 3$_2$ of the level shifter circuit is connected between an input IN$_2$ of a second inverter 41$_2$ of the drive circuit 4 and the second load output 12. In this example, the second input 14 of the electronic circuit is a differential input with a first input node 14$_1$ and a second input node 14$_2$. The first input node 14$_1$ is connected to the control node of the first level shifter transistor 3$_1$ and the second input node 14$_2$ is connected to the control node of the second level shifter transistor 3$_2$.

Referring to FIG. 7, the first and second inverter 41$_1$, 41$_2$ of the drive circuit 4 are cross-coupled. That is, an output OUT$_1$ of the first inverter 41$_1$ is connected to the input IN$_2$ of the second inverter 41$_2$ and an output OUT$_2$ of the second inverter 41$_2$ is connected to the input IN$_1$ of the first inverter 41$_1$. Each of these first and second inverters 41$_1$, 41$_2$ has a first supply input and a second supply input. The first supply input is connected to a first supply input 15 of the electronic circuit and the second supply input is connected to the second load output 11 of the electronic circuit. In this example, the drive circuit 4 is configured to generate the output signal Sout at the drive output 16 as a voltage that is referenced to the first load output 11.

Referring to FIG. 7, the drive circuit 4 further includes a comparator 42 having a first input connected to the output OUT$_1$ of the first inverter 41$_1$ and a second input connected to the output OUT$_2$ of the second inverter 41$_2$. A driver 43 receives an output signal S42 from the comparator 42 and generates the output signal Sout based on the comparator output signal S42. In the example illustrated in FIG. 7, the driver 43 includes an inverter with a low-side transistor 43L and a high-side transistor 43H. Each of these transistors 43H, 43L has a load path and a control node. The load paths of these transistors 43L, 43H are connected in series between the supply node 15 and the first load output node 11. Further, the control nodes of these transistors 43H, 43L are connected with each other and connected to the output of the comparator 42. The drive output 16 is formed by a circuit node common to the load nodes of the transistors 43L, 43H of the driver 43. According to one example, the low-side transistor 43L and the high-side transistor 43H are complementary transistors. Just for the purpose of illustration, the circuit symbol of the low-side transistor 43L shown in FIG. 7 represents a n-type transistor and the circuit symbol of the high-side transistor 43H shown in FIG. 7 represents a p-type transistor.

In the example shown in FIG. 7, the second input 14 is configured to receive complementary input signals Sin2$_1$, Sin2$_2$ at the first and second input nodes 14$_1$, 14$_2$. According to one example, each of these input signals Sin2$_1$, Sin2$_2$ is a voltage referenced to the second load output 12. "Complementary" means that, at the same time, one of these input signals Sin2$_1$, Sin2$_2$ switches on the respective level shifter transistor 3$_1$, 3$_2$ and the other one of these input signals Sin2$_1$, Sin2$_2$ switches off the respective level shifter transistor 3$_1$, 3$_2$. In the level shifter shown in FIG. 7, the level shifter output signal S3 shown in FIG. 1 is given by electrical potentials generated by the level shifter transistors 3$_1$, 3$_2$ at the inputs IN$_1$, IN$_2$ of the first and second inverters 41$_1$, 41$_2$.

The output signal Sout generated by the drive circuit 4 has one of two different signal levels dependent on which of the first and second level shifter transistors 3$_1$, 3$_2$ is in the on-state and which is in the off-state one. This is explained in the following. The output signal Sout has a first signal level when the comparator output signal S42 switches on the high-side switch 43H and switches off the low-side switch 43L of the driver 43, and the output Sout has a second signal level when the comparator output signal S42 switches off the high-side switch 43H and switches on the low-side switch 43L. In the example illustrated in FIG. 7, the first signal level essentially equals a voltage level of a supply voltage $V_{SUP2}$ received by the electronic circuit between the first supply input 15 and the first load output node 11. An example of generating this supply voltage $V_{SUP2}$ is explained herein further below. The second signal level of the output signal Sout is essentially zero in this example.

The comparator output signal S42 can have two different signal levels, a first signal level that switches on the high-side switch 43H and switches off the low-side switch 43L of the driver 43 and a second signal level that switches off the high-side switch 43H and switches on the low-side switch 43L. A signal level of the comparator output signal S42 is dependent on signal levels of signals $V_{OUT1}$, $V_{OUT2}$ at the outputs OUT$_1$, OUT$_2$ of the inverters 41$_1$, 41$_2$. According to one example, these output signals $V_{OUT1}$, $V_{OUT2}$ are voltages referenced to the first load output 11 and each can have two different signal level, a first signal level that essentially equals the voltage level of the supply voltage $V_{SUP2}$ and a second signal level that essentially equals zero. Due to the cross-coupling of the inverters 41$_1$, 41$_2$, at the same time, the output signal $V_{OUT1}$, $V_{OUT2}$ of one of the two inverters 41$_1$, 41$_2$ has the first signal level and the output voltage $V_{OUT1}$, $V_{OUT2}$ of the other one of the two inverters 41$_1$, 41$_2$ has the second signal level. The signal level of the comparator output signal S42 is dependent on which of the inverter output signals $V_{OUT1}$, $V_{OUT2}$ has the first signal level and which has the second signal level. The signal levels of the inverter output signals $V_{OUT1}$, $V_{OUT2}$ are dependent on the switching state of the level shifter transistors 3$_1$, 3$_2$. When, for example, the first level shifter transistor 3$_1$ is in the on-state and the second level shifter transistor 3$_2$ is in the off-state the output signal $V_{OUT1}$ of the first inverter 41$_1$ has the first signal level and the output signal $V_{OUT2}$ of the second inverter 41$_2$ has the second signal level.

In the circuit according to FIG. 7, the cross-coupled inverters 41$_1$, 41$_2$ form a bistable circuit that changes its state when one of the two (2) level shifter transistors 3$_1$, 3$_2$ switches on and maintains the state after the one of the two level shifter transistors 3$_1$, 3$_2$ has been switched off until the other one of the two level shifter transistors 3$_1$, 3$_2$ switches on. That is, the two level shifter transistors 3$_1$, 3$_2$ just trigger the change of the state of the bistable circuit.

Figure 8:
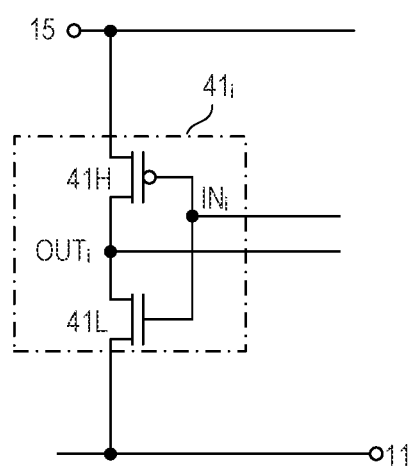
FIG. 8 shows an inverter of the drive circuit shown in FIG. 7 in detail.

FIG. 8 shows one example of how the first and second inverters 41$_1$, 41$_2$ may be implemented. In FIG. 8, reference number 41$_i$, represents an arbitrary one of the first and second inverters 41$_1$, 41$_2$, IN$_i$ denotes the input of the inverter 41$_i$, and OUT$_i$, denotes the output of the inverter 41$_i$. In this example, the inverter 41$_i$, includes two complementary transistors, a high-side transistor 41H and a low-side transistor 41L, that each have a load path and a control node. The load paths of these transistors 41H, 41L are connected in series between the supply node 15 and the first load output 11. The output OUT$_i$ is formed by a circuit node that is common to the load paths of the two transistors 41L, 41H. The control nodes of the transistors 41L, 41H are connected with each other and form the input IN$_i$ of the inverter 41$_1$.

If the inverters in the circuit according to FIG. 7 are implemented in accordance with FIG. 8, each of the level shifter transistors 3$_1$, 3$_2$ forms a voltage divider with the transistors of that inverter to the output of which it is connected. For example, the first level shifter transistor 3$_1$ forms a voltage divider with the high-side transistor of the second inverter 41$_2$, and the second level shifter transistor 3$_2$ forms a voltage divider with the high-side transistor of the first inverter $41_1$. The low side transistors of the inverters $41_1$, $41_2$ prevent the potentials at the inputs $IN_1$, $IN_2$ from dropping below the potential at the first load output node 11.

Figure 9:
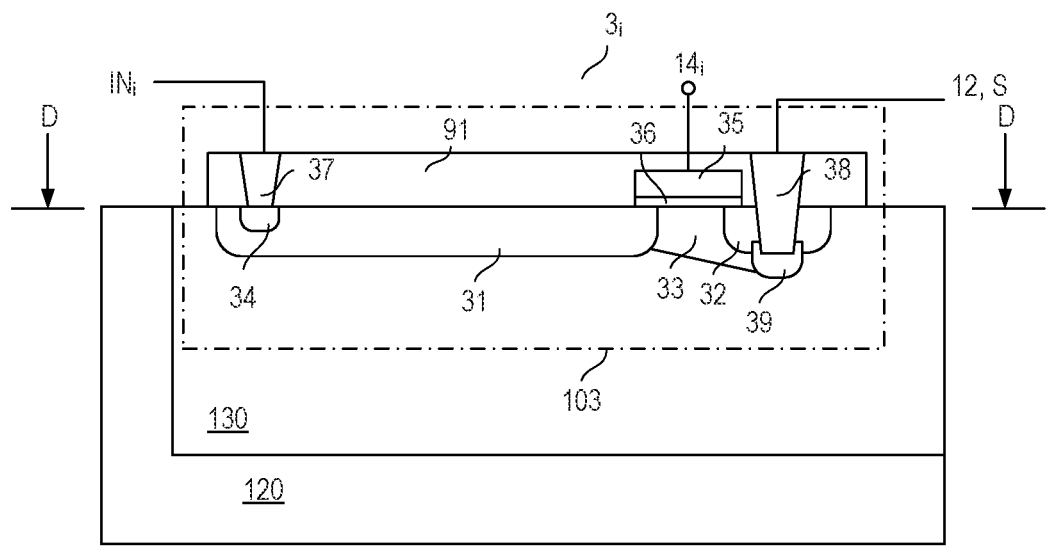
FIG. 9 shows one example of a level shifter transistor integrated in a level shifter region of the semiconductor body.

According to one example, the level shifter transistors $3_1$, $3_2$ are implemented as lateral transistor devices in the level shifter region 103. One example of how the level shifter transistors $3_1$, $3_2$ may be implemented is illustrated in FIG. 9. FIG. 9 shows a vertical cross-sectional view of one section of the semiconductor body 100 that includes the level shifter region 103. FIG. 9 shows a vertical cross-sectional view of one of the level shifter transistors $3_1$, $3_2$ (reference character $3_i$ denotes an arbitrary one of the two level shifter transistors $3_1$, $3_2$). In the example illustrated in FIG. 9, the level shifter transistor $3_i$ is a transistor of the first doping type and includes a source region 32 and a drain region 34 that are spaced apart from each other in a horizontal direction of the semiconductor body 100. According to one example, the source region 32 and the drain region 34 are arranged such that the source region 32 is closer to the inner region (not shown in FIG. 9) than the drain region 34. In other words, the drain 34 is closer to the edge surface (not shown) than the source region 32. The drain region 32 is embedded in a drift region 31 of the first doping type. The drift region 31 has a lower doping concentration than the drain region 34 and essentially defines the voltage blocking capability of the level shifter transistor $3_i$. The voltage blocking capability is the voltage the level shifter transistor $3_i$ can withstand in the off-state.

Referring to FIG. 9, the level shifter transistor $3_i$, further includes a body region 33 of the second doping type between the source region 32 and the drift region 31. This body region 33 may have the same doping concentration as the second region 130, in which the source regions 32 and the drift region 31 are embedded, or may have a doping concentration different from the second region 130. Further, a gate electrode 35 is adjacent the body region 33 and dielectrically insulated from the body region 33 by a gate dielectric 36.

Referring to FIG. 7, each of the level shifter transistors $3_1$, $3_2$ has its load path connected between the second load output node 12 (that is connected to the source node S of the first transistor device 2) and the input of a corresponding inverter $41_1$, $41_2$.

Referring to FIG. 9, the drain region 34 can be connected to the input (represented by $IN_i$ in FIG. 9) of the corresponding inverter and the source region 32 can be connected to the second load output node 12. Wiring arrangements that connect the drain region 34 to the input $IN_i$ of the corresponding inverter and that connect the source region 32 to the second load output node 12 and the source node S of the first transistor device can be formed on top of the first surface 107 and may include conductors embedded in or formed on top of at least one insulation layer 91. The conductor connecting the drain region 34 to the input $IN_i$ of the corresponding inverter may include a first contact electrode 37 connected to the drain region 34 and the conductor connecting the source region 32 to the second load output 12 and the source node S may include a second contact electrode 38 connected to the source region 32. According to one example, the second contact electrode 38 extends into the semiconductor 100 and is connected to the second region 130. Optionally, a contact region 39 of the second doping type that is doped higher than the second region 103 is formed between the second contact electrode 38 and the second region 130. According to one example, this second contact electrode 38 forms the contact explained with reference to FIG. 4 between the source node S and the second region 130.

Figure 10:
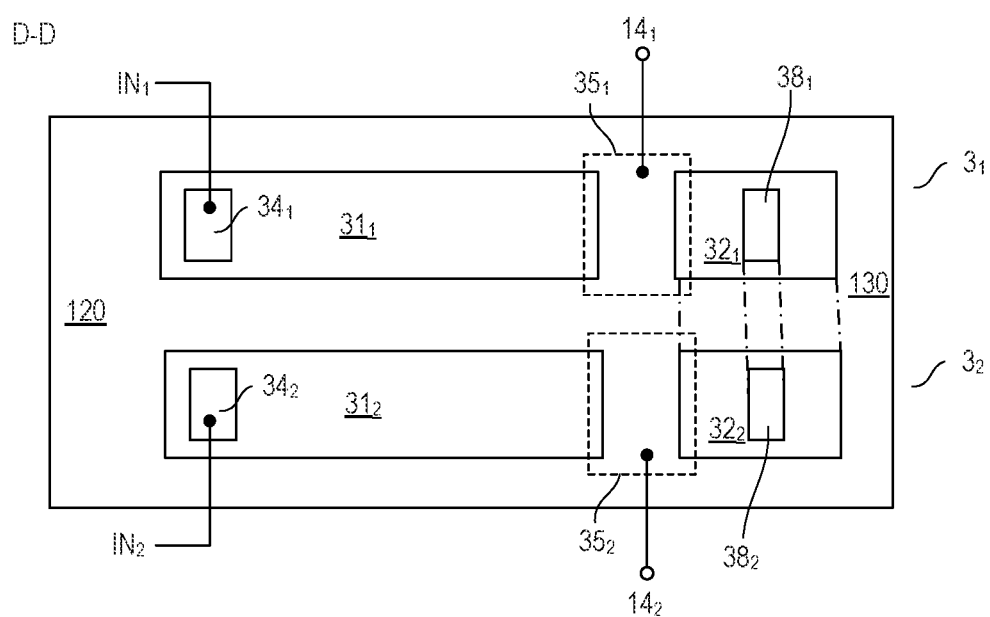
FIG. 10 shows a horizontal cross-sectional view of two (2) level shifter transistors of the type shown in FIG. 9.

FIG. 10 shows a horizontal cross-sectional view in a section plane D-D of the level shifter region 103 shown in FIG. 9 and shows the two level shifter transistors $3_1$, $3_2$, wherein each of these level shifter transistors is implemented in accordance with the example shown in FIG. 9. The features of the level shifter transistors $3_1$, $3_2$ shown in FIG. 10 are labelled with the same reference characters used in FIG. 9, wherein a subscript index "1" has been added to the reference numbers of the first level shifter transistor $3_1$ and a subscript index "2" has been added to the reference numbers of the second level shifter transistor $3_2$. Referring to FIG. 10, the drift regions $31_1$, $31_2$ and the source regions $32_1$, $32_2$ of the two level shifter transistors $3_1$, $3_2$ can be separated from each other by sections of the second region 130 so that a junction isolation is formed between the drift region $31_1$, $31_2$. The source regions $32_1$, $32_2$ can be formed by two separate regions separated by a section of the first region 120. According to another example (illustrated in dashed and dotted lines in FIG. 10), the source regions $32_1$, $32_2$ are formed by one continuous semiconductor region.

Figure 11:
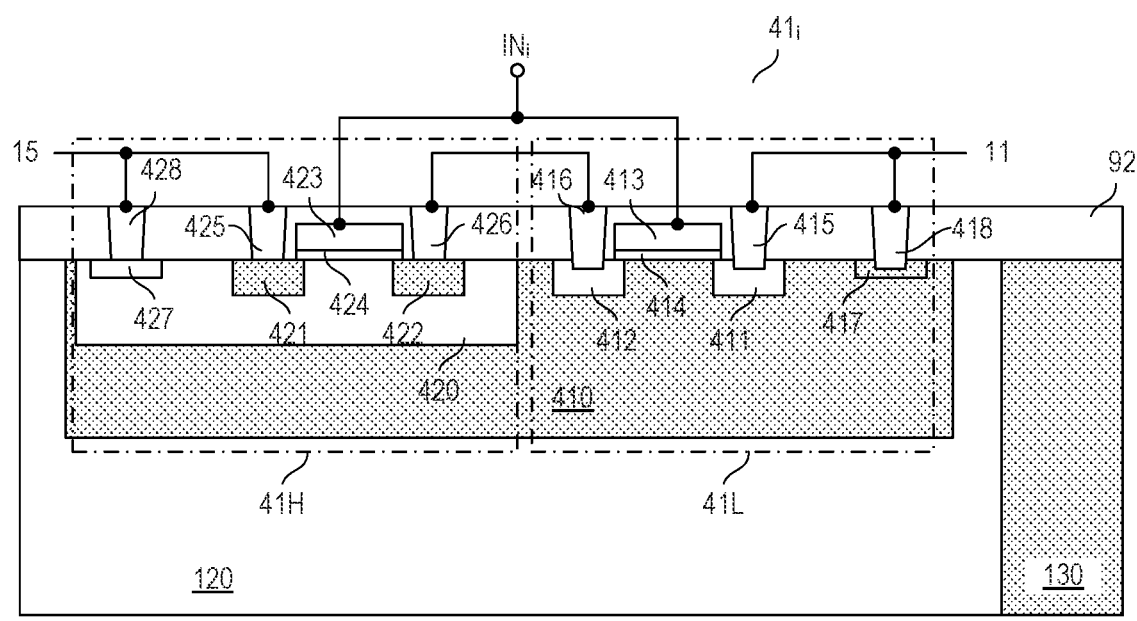
FIG. 11 shows one example of an inverter of the drive circuit integrated in a drive circuit region of the semiconductor body.

Referring to the above, the drive circuit 4 is integrated in the first drive circuit region 104 of the semiconductor body 100. One example of how the drive circuit 4 may be implemented is illustrated in FIG. 11. FIG. 11 illustrates one example of implementing one of the two inverters $41_1$, $41_2$ (reference number $41_i$ represents an arbitrary one of these inverters $41_1$, $41_2$). It should be noted that the other one of the two inverters as well as the inverter of the driver 43 can be implemented in the same way. For the ease of understanding, doped regions of the second doping type are drawn as grey regions and doped regions of the first doping type are drawn as white regions in the example shown in FIG. 11.

Referring to FIG. 11, the inverter $41_i$ includes a doped region 410 of the second doping type, which is referred to as first well in the following. The active device regions of the high-side transistor 41H and the low-side transistor 41L are embedded in this first well 410.

Referring to FIG. 11, the low-side transistor 41L includes a source region 411 and a drain region 412 of the first doping type and spaced apart from each other in a horizontal direction. A body region of the low-side transistor 41L may be formed by a section of the first well 410. Optionally, the body region is a region with a doping concentration different from the doping concentration of the first well 410. A gate electrode 413 of the low-side transistor 41L is adjacent the body region and dielectrically insulated from the body region by a gate dielectric 414. The source region 411 is connected to the first load output node 11 via a conductor that may formed in or on top of an insulator 92 and may include a source electrode 415. Further, the first well 410 (forming the body region of the low-side transistor 41L) may be connected to the first load output 11 via a contact electrode 418 and a contact region 417 of the second doping type.

Referring to FIG. 11, the high-side transistor 41H includes a second well 420 of the first doping type in the first well 410 of the first doping type. Further, the high-side transistor 41H includes a source region 421 and a drain region 422 of the second doping type in the second well 420 and spaced apart from each other in a horizontal direction of the semiconductor body 100. A body region of the high-side transistor 41H may be formed by a section of the second well 420. Optionally, the body region is a region with a doping concentration different from the doping concentration of the second well 420. A gate electrode 423 of the high-side transistor 41H is adjacent the body region and dielectrically insulated from the body region by a gate dielectric 424. The source region 421 of the high-side transistor 41H is connected to the second supply input 15 via a conductor that may include a source electrode 425. Further, the second supply input 15 may be connected to the second well 420 via a contact electrode 428 and a higher doped contact region 427 of the first doping type.

Referring to FIG. 11, the drain region 422 of the high-side transistor 41H is connected to the drain region 412 of the low-side transistor 41L via a conductor. This conductor may include a first drain electrode 416 connected to the drain region 412 of the low-side transistor 41L and a drain electrode 426 connected to the drain region 422 of the high-side transistor 41H.

As can be seen from FIG. 7, for example, the potential at the first supply input 15 may become higher than the potential at the drain node D of the first transistor device 2. In the inverter $41_i$ according to FIG. 11, a pn-junction between the first well 410 and the second well 420 absorbs the voltage that may occur between the first supply input 15 and the first region 120 (which is connected to the drain node D) and, therefore, prevents a current flow from the first supply input to the drain region 24 of the transistor device 2.

The first drive circuit region 104 may include several first wells of the type illustrated in FIG. 11 that are spaced apart from each other so that a junction isolation is formed between these first wells. In each of these first wells, one inverter can be implemented. Further, the comparator 42 may include transistor of the first doping type and/or the second doping type. These transistors can be implemented in the same way as the transistors 41L, 41H illustrated in FIG. 11.

Figure 12A:
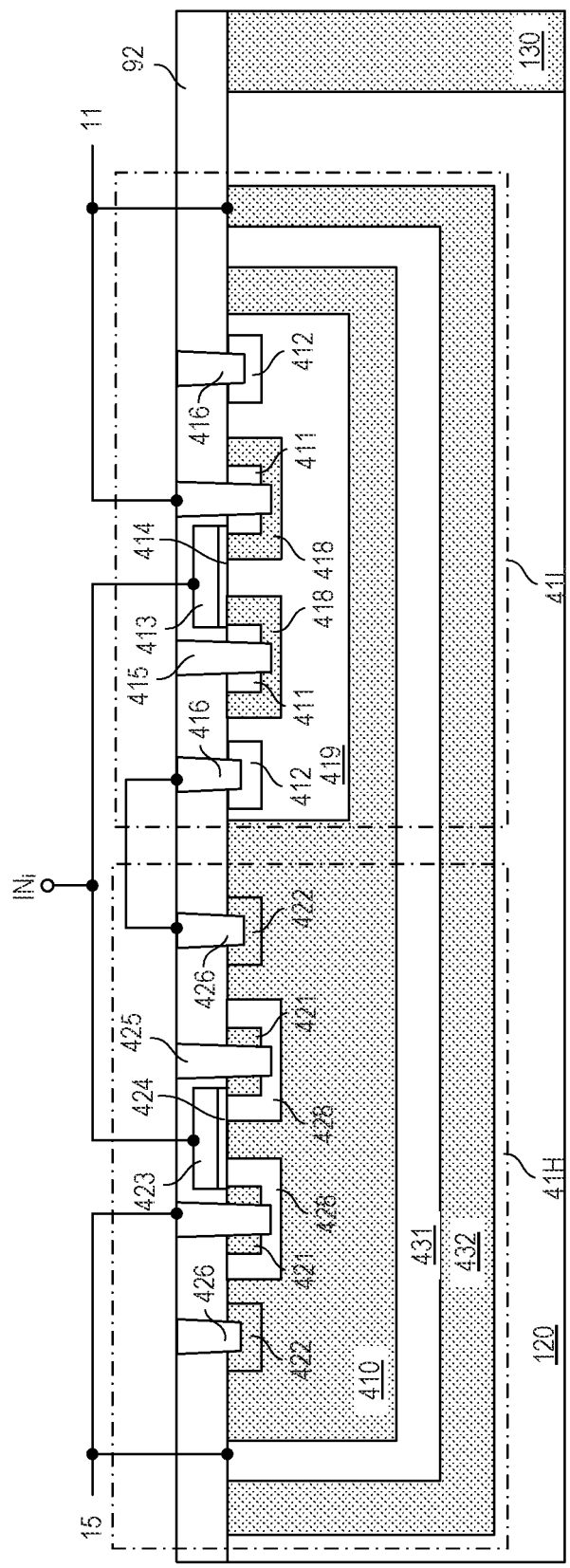
FIGS. 12A and 12B shows another one example of an inverter of the drive circuit integrated in the drive circuit region of the semiconductor body.
Figure 12B:
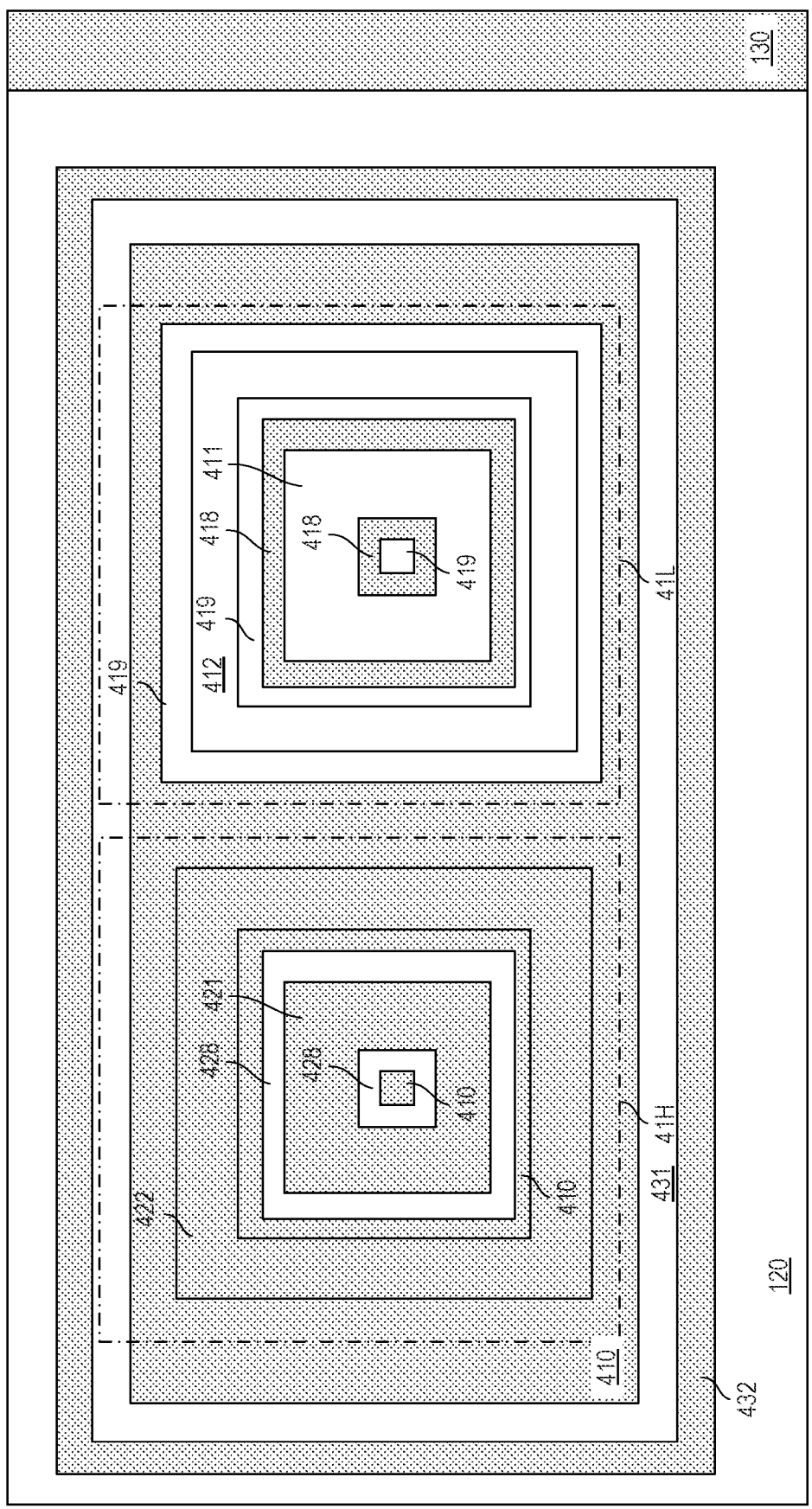

FIGS. 12A and 12B illustrate another implementation of the inverter $41_i$. FIG. 12A shows a vertical cross-sectional view and FIG. 12B shows a horizontal cross-sectional view of the first drive circuit region 104. In the example shown in FIGS. 12A and 12B, source regions 411, 421 and body regions 418, 428 of the low-side and the high-side transistor 41L, 41H are ring-shaped regions. Further, source regions 412, 422 of these transistors 41L, 41H are ring-shaped regions that surround the body regions 418, 428. The source region 422 of the high-side transistor 41H is embedded in the first well 410, and the body region of the high-side transistor 41H may be formed by a section of the first well 410 (or by a region having a doping concentration different from the doping concentration of the first well 410). Further, the source, body and drain regions 411, 418, 412 of the low-side transistor 41L are embedded in a further well 419 of the first doping type that is embedded in the first well 410. The source region 412 of the low-side transistor 41L is embedded in this further well 419. The body region of the low-side transistor 41L may be formed by a section of this further well 419 or by another region of the first doping type having a doping concentration different from the doping concentration of the further well 419. The further well 419 is embedded in the first well 410.

In the example shown in FIG. 11, in which the source region 421 and the drain region 422 of the high-side transistor 41H are embedded in the second well 420, the pn-junction formed between first well 410 and the second well 420 absorbs a voltage between the first supply input 15 and the drain node D (drain region 24) of the transistor device 2. In the example shown in FIGS. 12A and 12B, in which the source region 422 is embedded in the first well 410 and in which the potential of the source region 422 essentially equals the potential at the supply input 15 when the high-side transistor 41H is in the on-state, a further region 431 of the first doping type surrounding the first well 410 and a further region 432 of the second doping type surrounding the further region 431 of the first doping type and adjoining the first region 120 form two pn-junctions between the first well 410 and the first region 120 and, therefore, prevent a current flow from the first supply input 15 to the drain node D (the drain region 24) of the transistor device 2. According to one example, the further region 431 of the first doping type is connected to the first supply input 15 and the further region 432 of the second doping type is connected to the first load output node 11.

Transistors 41L, 41H of the type shown in FIG. 11 may be implemented using a CMOS process, and transistors of the type shown in FIGS. 12A and 12B may be implemented using a DMOS process.

Referring to the above, the drive voltage $V_{GS}$ of the first transistor device 2 is generated based on the first input signal Sin1 received at the first input 13. According to one example, the first input signal Sin1 is a voltage referenced to the source node S of the first transistor device 2 and is directly used to drive the first transistor device 2. That is, the first transistor device 2 receives the first input signal Sin1 as the drive voltage $V_{GS}$.

In each of the examples illustrated in FIGS. 11, 12A and 12B the signal received at the input $IN_i$ of the inverter $41_i$ from the level shifter 3 is an internal signal when the level shifter 3 is integrated in the semiconductor body 100 or an external signal when the level shifter 3 is an external circuit that is not integrated in the semiconductor body 100.

Figure 13:
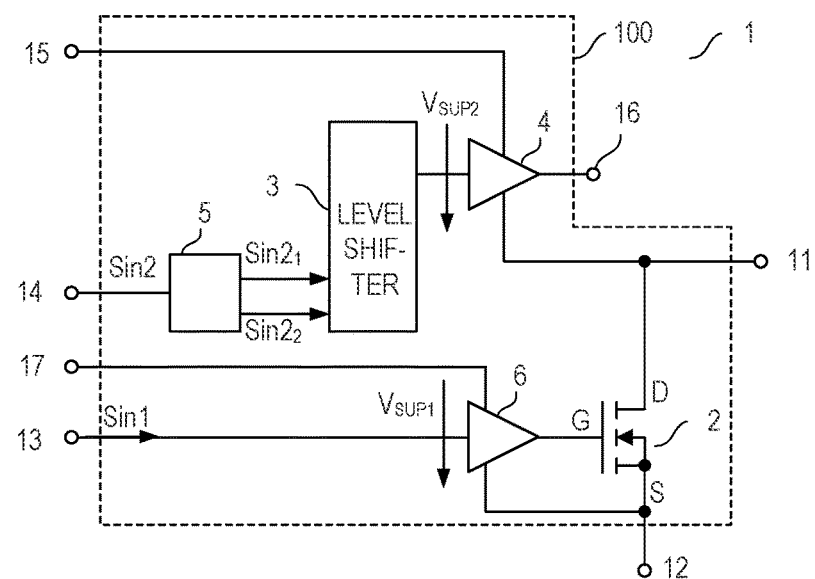
FIG. 13 shows one example of an electronic circuit that is based on the electronic circuit shown in FIG. 1 and further includes an input circuit connected between an input and the level shifter and a further drive circuit coupled to the first transistor device.

According to another example shown in FIG. 13 the electronic circuit 1 includes a further drive circuit 6 that receives the first input signal Sin1 and generates the drive voltage $V_{GS}$ based on the first input signal Sin1. In this example, the further drive circuit 6 receives a supply voltage $V_{SUP1}$ via a further supply input 17. According to one example, this further supply voltage $V_{SUP1}$ is a voltage referenced to the source node S and the second load output 12.

In the example illustrated in FIG. 7, the level shifter 3 is a differential level shifter with two level shifter transistors $3_1$, $3_2$ and receives two input signals $Sin2_1$, $Sin2_2$. These input signals $Sin2_1$, $Sin2_2$ can be received from an external control circuit such as, for example, a microcontroller. According to another example illustrated in FIG. 13, the electronic circuit 1 receives one second input signal Sin2, which can be a voltage referenced to the second load output 12. In this example, the electronic circuit 1 includes an input circuit 5, that receives the second input signal Sin2 and is configured to generate the two input signals $Sin2_1$, $Sin2_2$ of the level shifter 3 based on the second input signal Sin2.

Figure 14:
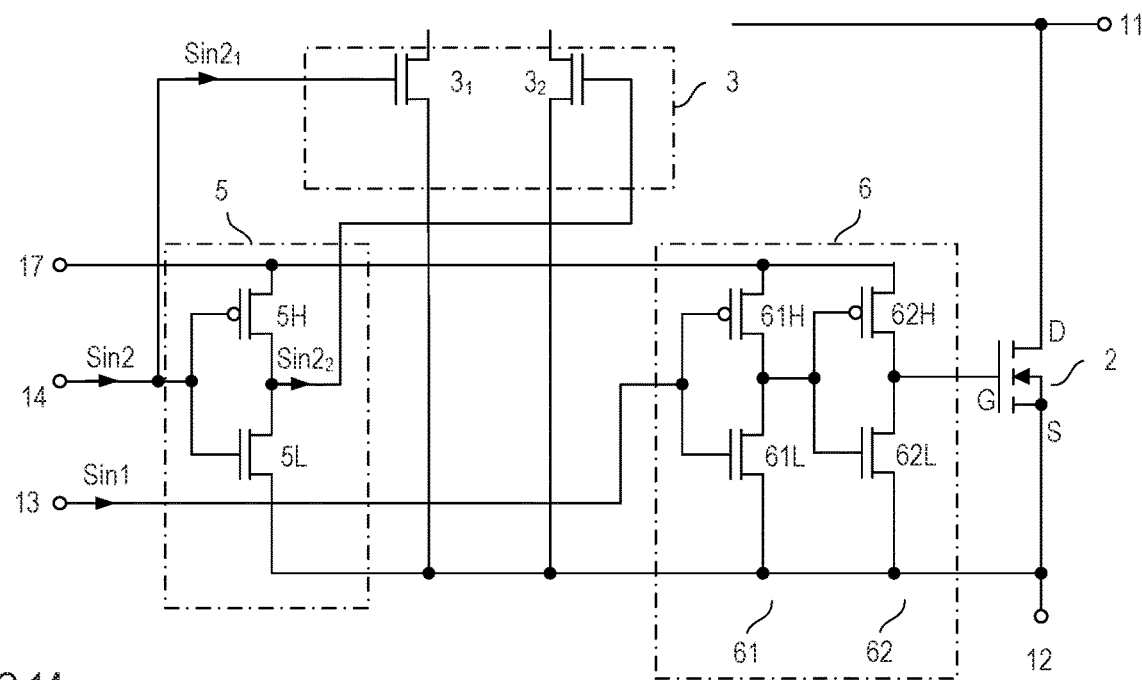
FIG. 14 shows examples of the input circuit and the further drive circuit.

Examples of the input circuit 5 and the second drive circuit 6 are illustrated in FIG. 14. In this example, the input circuit 5 includes an inverter with a low-side transistor 5L and a high-side transistor 5H that receives the second input signal Sin2 at an input. At the output of the inverter the second level shifter input signal $Sin2_2$ received by the second level shifter transistor $3_2$ is available. The first level shifter input signal $Sin2_1$ equals the second input signal Sin2 in this example. Each of the low-side transistor 5L and the high-side transistor 5H has a load path and a control node. The load paths are connected in series between the second supply input 17 and the second load output 12 and the control nodes are connected with each other and form the input of the inverter 5L, 5H.

Referring to FIG. 14, the second drive circuit 6 may include a first inverter 61 and a second inverter 62 each including a low-side transistor 61L, 62L and a high-side 61H, 62H. Each of the low-side transistors 61L, 62L and the high-side transistors 61H, 62H has a load path and a control node. The load paths of the high-side transistor 61H, 62H and the low side transistor 61L, 62L of each inverter 61, 62 are connected in series between the second supply input 17 and the second load output 12. Further, the control nodes are connected with each other and form an input of the respective inverter 61, 62. An output of each inverter 61, 62 is formed by a circuit node common to the load paths of the high-side transistor 61H, 62H and the low side transistor 61L, 62L of the respective inverter 61, 62. The first inverter 61 receives the first input signal Sin1 at the input, and the input of the second inverter 62 is connected to the output of the first inverter 61. The drive voltage $V_{GS}$ is available between the output of the second inverter 62 and the second load output node 12.

Figure 15:
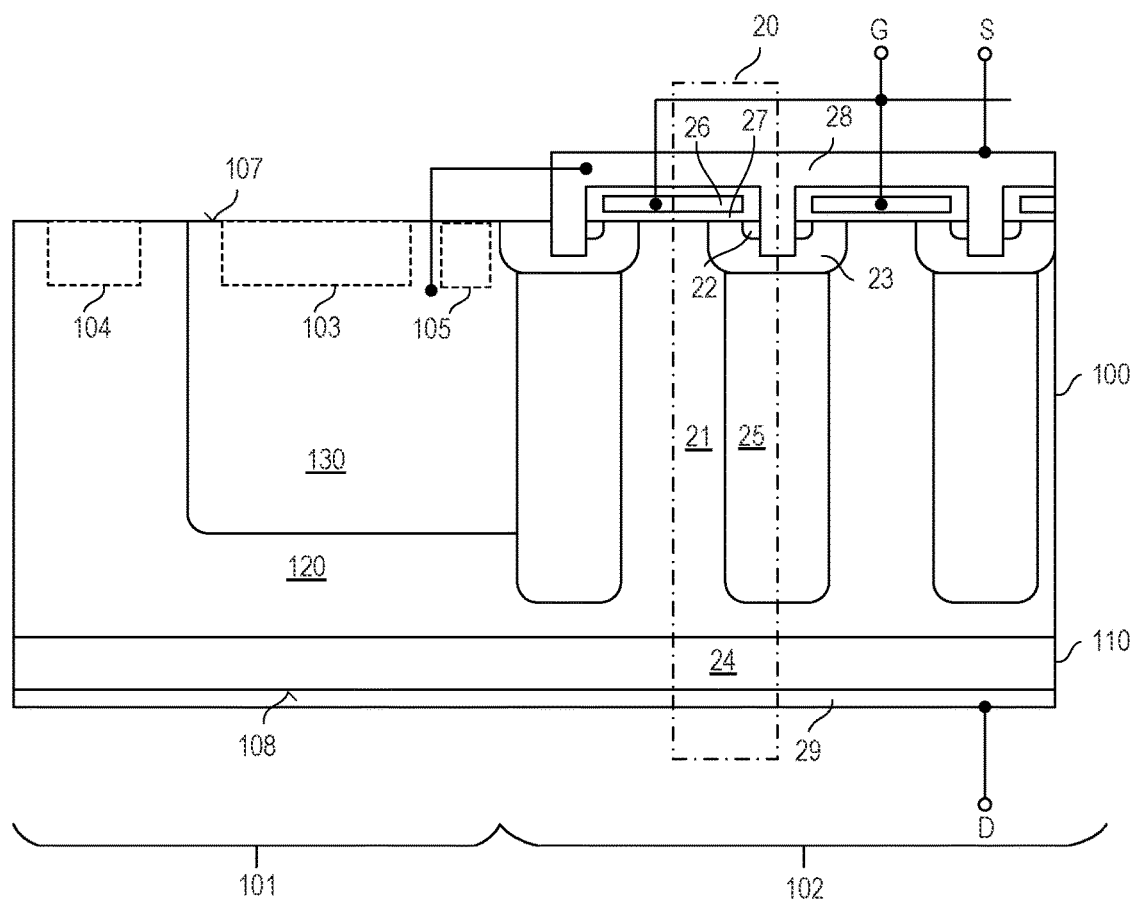
FIG. 15 schematically illustrates a vertical cross-sectional view of one section of a semiconductor body in which the first transistor device, the level shifter, the drive circuit, the further drive circuit and the input circuit are integrated.

According to one example, the second drive circuit 6 and the input circuit 5 are integrated in a second drive circuit region 105. This second drive circuit region 105 is schematically illustrated in FIG. 15 that shows a vertical cross-sectional view of the semiconductor body 100 in the section plane A-A explained above. Referring to FIG. 15, the second drive circuit region 105 is arranged between the level shifter region 103 and the inner region 102 and is embedded in the second region 130. Referring to FIG. 14, each of the input circuit 5 and the second drive circuit 6 includes at least one inverter. These inverters can be implemented in the second drive circuit region 105 in accordance with the examples explained with reference to FIGS. 11 and 12A-12B. According to one example, in this case, the first well 410 shown in FIG. 11 and the further region 432 of the second doping type shown in FIGS. 12A and 12B may be formed by the second region 130.

Figure 16:
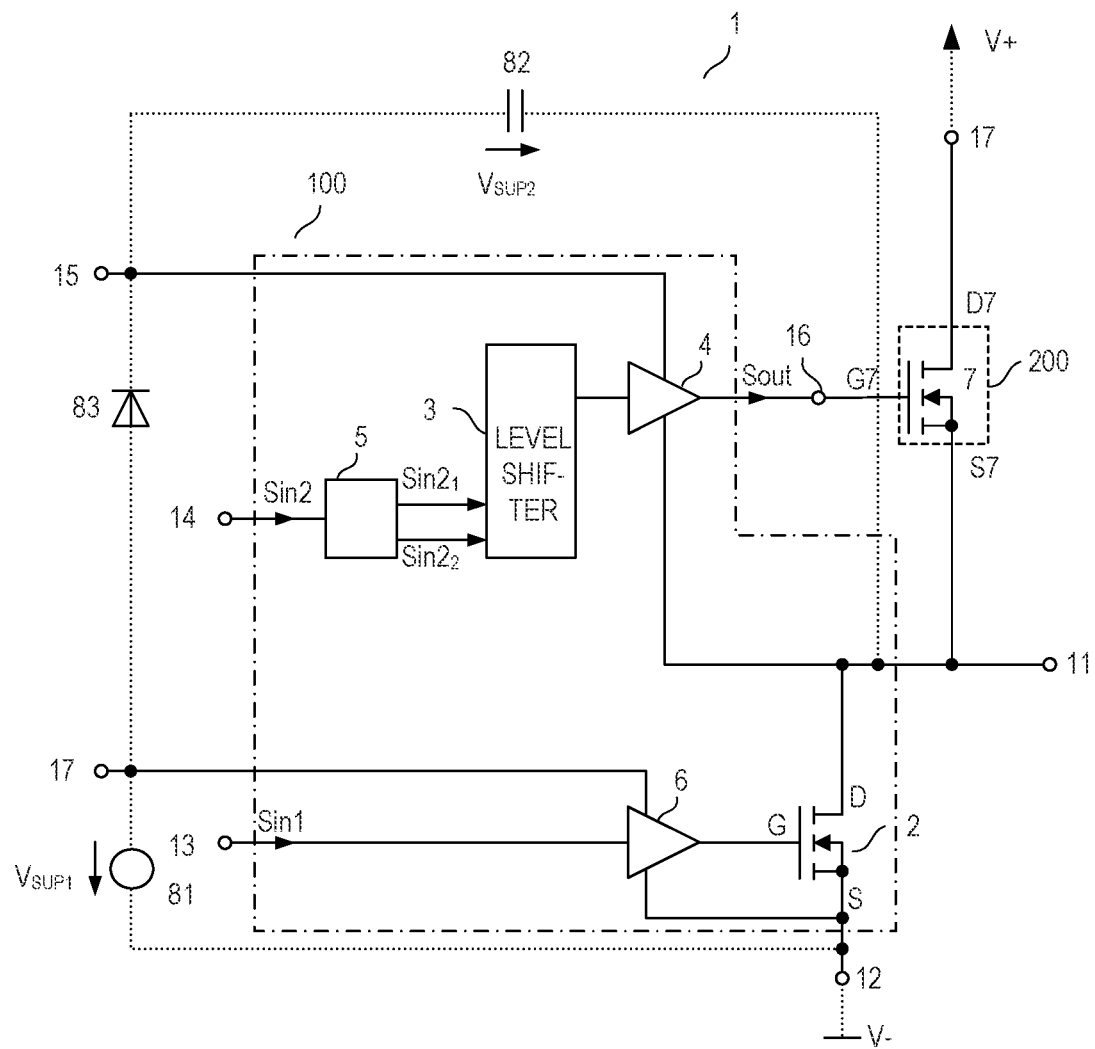
FIG. 16 shows one example of an electronic circuit that further includes the second transistor device.

Referring to the above, the drive circuit 4 that generates the output signal Sout based on the second input signal Sin2 is configured to drive a second transistor device. One example of an electronic circuit that includes the first transistor device 2 and the second transistor device 7 is illustrated in FIG. 16. In this example, the second transistor device 7 is of the same transistor type as the first transistor device 2. That is, in this example, the second transistor device 7 is a n-type enhancement MOSFET. The second transistor device 7 includes a control node (gate node) G7 and a load path between a drain node D7 and a source node S7. Further, the load path D7-S7 of the second transistor device 7 is connected in series with the load path D-S of the first transistor device 2 so that the first transistor device 2 and the second transistor device 7 form a half-bridge circuit. The second transistor device 7 is driven by the output signal Sout, which, in this example, is a voltage between the drive output 16 and the first load output 11 to which the source node S7 of the second transistor device 7 is connected.

Referring to FIG. 16, the (first) supply voltage $V_{SUP1}$ received between the second supply node 17 and the second load output 12 can be generated by an external voltage source 81 connected between the second supply input 17 and the second load output node 12 of the electronic circuit. The (second) supply voltage $V_{SUP2}$ received by the electronic circuit between the first supply input 15 and the first load output node 11 can be generated by a bootstrap circuit based on the first supply voltage $V_{SUP1}$. Referring to FIG. 16, this bootstrap circuit may include a capacitor 82 connected between the first supply input 15 and the first load output node 11, and a diode 83 connected between the voltage source 81 and the capacitor 82. In this electronic circuit, the capacitor 82 is charged each time the first transistor device 2 switches on. When the first transistor device 2 switches off the charge stored in the capacitor 82 can be used by the drive circuit 4 to generate the output signal Sout and drive the second transistor device 7.

According to one example, the second transistor device 7 is integrated in a second semiconductor body 200. According to one example, only the second transistor device 7 is integrated in the second semiconductor body 200 while the first transistor device 2, the level shifter 3 and the drive circuit 4 are integrated in the first semiconductor body 100.

Figure 17:
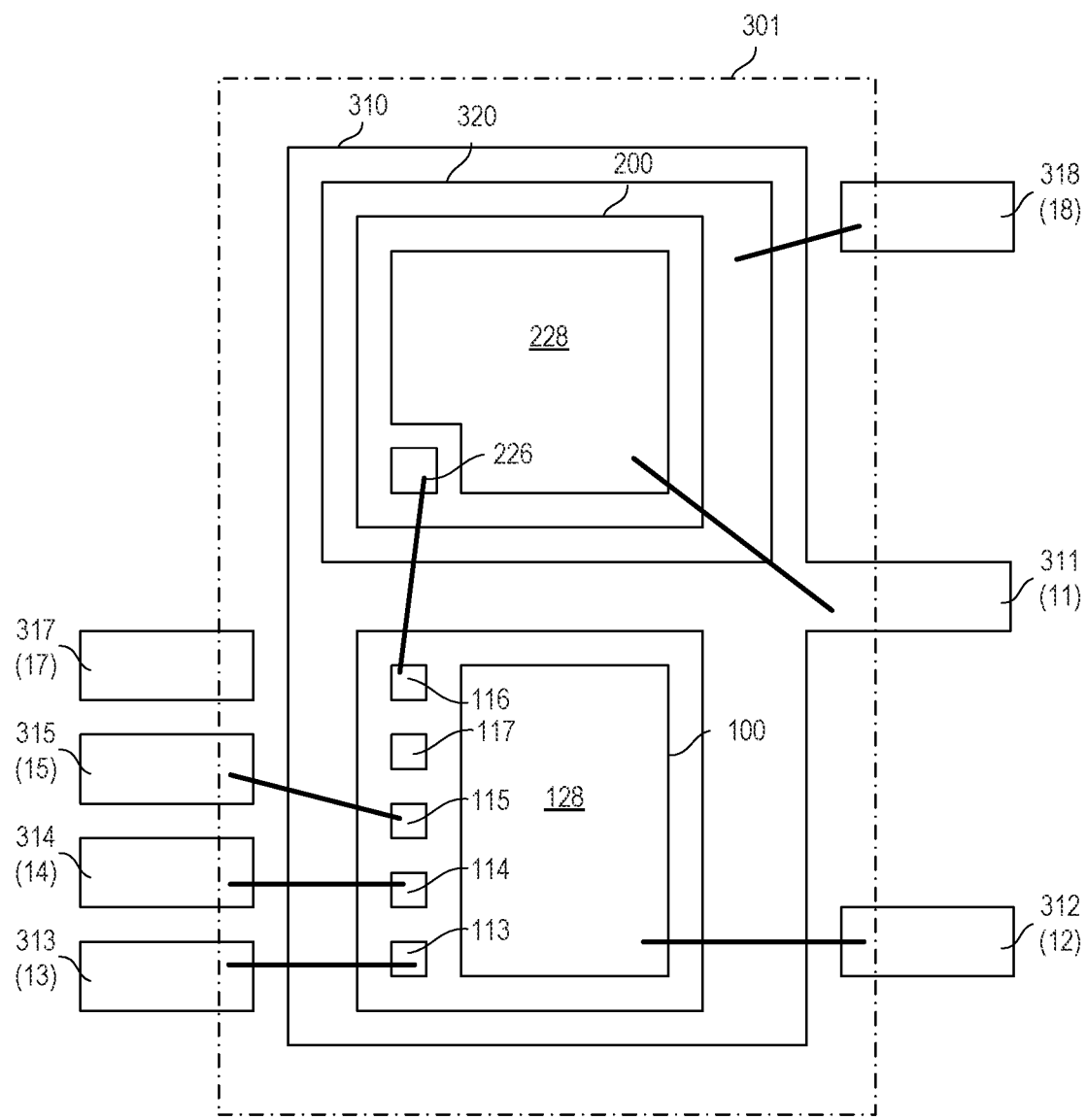
FIG. 17 illustrates one example of a module that includes an electronic circuit of the type shown in FIG. 16.

According to one example, the first and second semiconductor bodies 100, 200 are arranged in a common housing (package). One example of an arrangement with the first and second semiconductor bodies 100, 200 arranged in a common housing is illustrated in FIG. 17. FIG. 17 shows a top view of the arrangement, wherein the housing 301 is illustrated in dashed and dotted lines.

In the example shown in FIG. 17 the arrangement includes a first carrier 310 onto which the first semiconductor body 100 is mounted such that the drain node D is electrically connected to the first carrier 310. The first carrier 310 includes a pin 311 that protrudes from the housing 301 and forms the first load output node 11 of the electronic circuit. The second transistor device 7 integrated in this second semiconductor body 200 can be a vertical transistor device implemented in the same way as the first transistor device 2. In this case a drain node of the second transistor device is formed by a second surface of the second semiconductor body 200. This second surface of the second semiconductor body 200 is mounted on a second carrier 320. This second carrier 320 is mounted on the first carrier 310 but is electrically insulated from the first carrier 310. The second carrier 320 is electrically connected to a further output pin 318 that forms a further output node 18 shown in FIG. 16 of the electronic circuit. According to one example, the second carrier 320 is connected to the further output pin 318 by a bond wire. This, however, is only an example. A flat conductor, or the like, may be used as well.

On top of a first surface, the second semiconductor body 200 includes a source pad 228 that is connected to the source node S7 of the second transistor device 7, and a gate pad 226 connected to the gate node G7 of the second transistor device 7. On top of the first surface, the first semiconductor body 100 includes a source pad 128 that is connected to the source electrode 28 of the first transistor device 2. Further, on top of the first surface 107 of the first semiconductor body 100 a first and second input pad 113, 114 and a first and second supply pad 115, 117 are formed. The first input pad 113 is connected to a first input pin 313, and the second input pad 114 is connected to a second input pin 314. The first input pins 313 forms the first input 13 and the second put pin 314 forms the second input 14 of the electronic circuit. The first supply pad 115 is connected to a first supply pin 315 and the second supply 117 is connected to a second supply pin 317. The first supply pin 315 forms the first supply input 15 and the second supply pin 317 forms the second supply input 17. Further an output pad 116 on top of the first semiconductor body 100 forms the drive output 16 and is connected to the gate pad 226 of the second transistor device 7 inside the housing 301.

The source pad 128 on top of the first semiconductor body 100 is connected to a second output pin 312 that forms the second load output 12 of the electronic circuit. Further, the source pad 228 on top of the second semiconductor body 200 is connected to the first output pin 311. Just for the purpose of illustration, electrical connections between pads on top of the semiconductor bodies 100, 200 and input or output pins include bond wires in the example shown in FIG. 17, This, however, is only an example. These connections can be implemented using flat conductors, or any other type of electrical connections as well.

In the example illustrated in FIG. 17, the second transistor device integrated in the second semiconductor body 200 is a drain-down transistor, that is, the drain node of the second transistor device is formed by a surface of the semiconductor body 200 connected to the second carrier. According to another example (not shown) the second transistor device is a source-down transistor, in which the drain electrode and the gate electrode are accessible at the same side of the semiconductor body 200 and the source electrode is accessible at the opposite side. In this example, the second carrier 320 can be omitted; the second semiconductor body 200 can be mounted on the first carrier 310 such that the source electrode is connected to the first carrier 310 (and, in this way, to the drain node of the first transistor device 2 integrated in the first semiconductor body 100); and the drain electrode can be connected to the further output pin 318 via a connector, such as a bond wire, a flat conductor, or the like.

Figure 18:
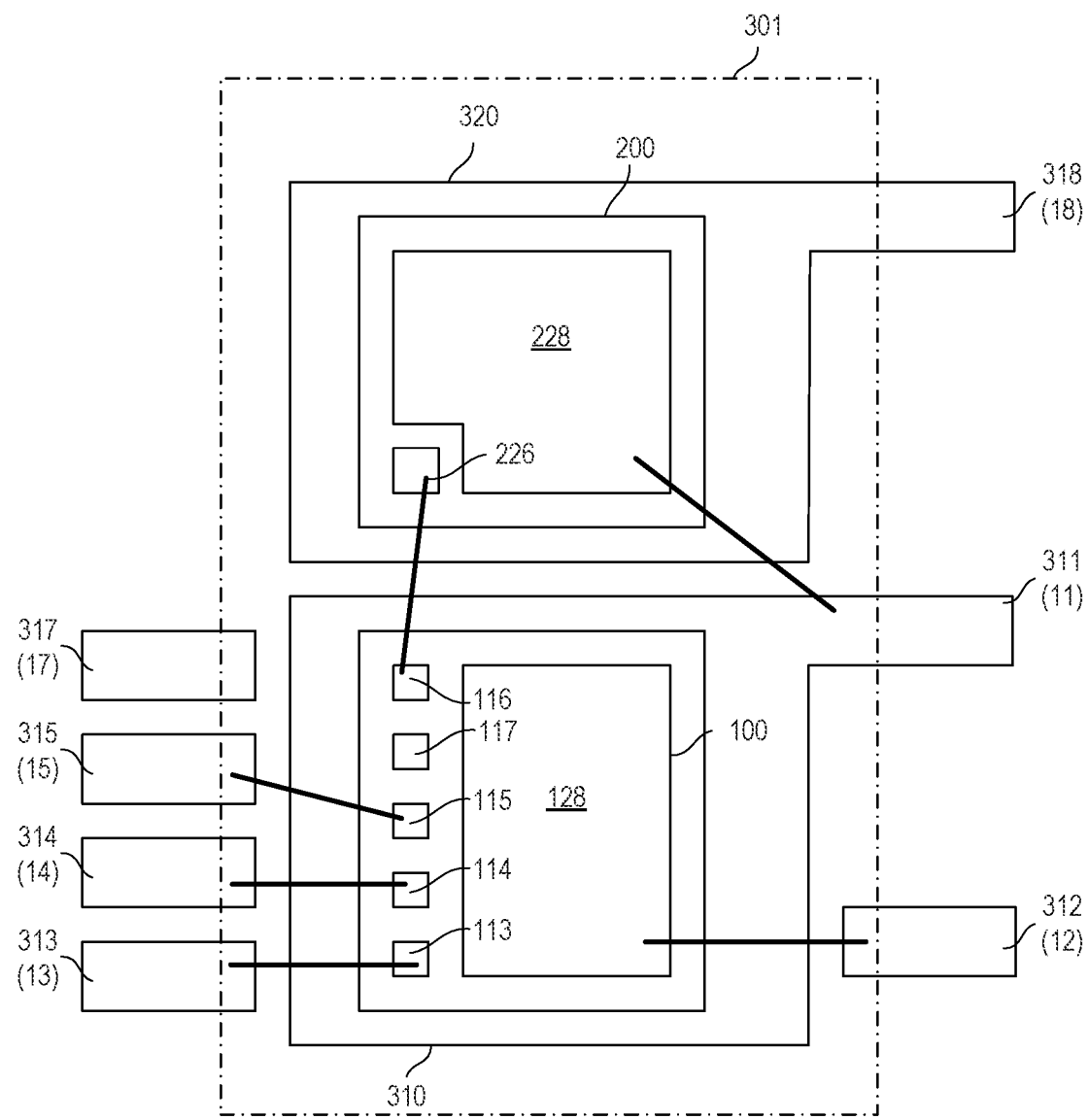
FIG. 18 illustrates another example of the module.

FIG. 18 shows a modification of the module shown in FIG. 17. The module according to FIG. 18 is different from the module according to FIG. 17 in that the first carrier 310 and the second carrier 320 are spaced apart from each other in a lateral direction and, thereby, electrically insulated from each other. In this example, the further output pin 18 can be formed by a part of the second carrier 320. Everything else explained with reference to the module shown in FIG. 17 applies to the module shown in FIG. 18 accordingly.

Although the present disclosure is not so limited, the following numbered examples demonstrate one or more aspects of the disclosure.

Example 1. An electronic circuit, including: a first transistor device integrated in an inner region of a first semiconductor body; a level shifter integrated in a level shifter region of the first semiconductor body; and a first drive circuit connected to the level shifter, integrated in a first drive circuit region of the semiconductor body, and configured to drive a second transistor device, wherein each of the level shifter region and the first drive circuit region is located in an edge region surrounding the inner region of the semiconductor body, and wherein the level shifter region is arranged closer to the inner region than the first drive circuit region.

Example 2. The electronic circuit of example 1, further including: a second drive circuit integrated in a second drive circuit region in the edge region of the first semiconductor body, wherein the second drive circuit is configured to receive a first input signal from a first input and drive the first transistor device based on the first input signal, and wherein the second drive circuit region is arranged closer to the inner region than the level shifter region.

Example 3. The electronic circuit of any combination of examples 1 to 2, further including: an input circuit integrated in the second drive circuit region and coupled between a second input and the level shifter.

Example 4. The electronic circuit of any combination of examples 1 to 3, wherein the first transistor device includes a plurality of transistor cells, each including: a drift region of a first doping type; a source region of the first doping type connected to a source node; a body region of a second doping type complementary to the first doping type; a drain region of the first doping type separated from the body region by the drift region and connected to a drain node; and a gate electrode adjacent the body region and dielectrically insulated from the body region by a gate dielectric.

Example 5. The electronic circuit of any combination of examples 1 to 4, wherein each of the plurality of transistor cells further includes: a compensation region adjoining the drift region.

Example 6. The electronic circuit of any combination of examples 1 to 5, further including: a first region of the first doping type and a second region of the second doping type in the edge region, wherein a pn-junction is formed between the first region and the second region, wherein the first region is connected to the drain node and the second region is connected to the source node, and wherein the level shifter region is embedded in the second region and the first drive circuit region is embedded in the first region.

Example 7. The electronic circuit of any combination of examples 1 to 6, wherein the second drive circuit region is embedded in the second region.

Example 8. The electronic circuit of any combination of examples 1 to 7, wherein a maximum doping concentration of each of the first region is higher than a maximum doping concentration of the drift region.

Example 9. The electronic circuit of any one of any combination of examples 1 to 8, wherein a maximum doping concentration of the second region is less than a maximum doping concentration of the drift region.

Example 9. The electronic circuit of any one of any combination of examples 1 to 8, wherein a maximum doping concentration of the second region is less than $1E16\ cm^{-3}$.

Example 11. The electronic circuit of any one of the preceding claims, wherein the level shifter includes at least one lateral transistor device.

Example 12. The electronic circuit of any combination of examples 1 to 11, wherein the first drive circuit includes at least one inverter.

Example 13. The electronic circuit of any combination of examples 1 to 12, wherein the second drive circuit includes at least one inverter.

Example 14. The electronic circuit of any combination of examples 1 to 13, further including the second transistor device, wherein a load path of the second transistor device is connected in series with a load path of the first transistor device.

Example 15. The electronic circuit of any combination of examples 1 to 14, wherein the second transistor device is integrated in a further semiconductor body.

Example 16. The electronic circuit of any combination of examples 1 to 15, wherein the first semiconductor body and the second semiconductor body are arranged in a common housing.

Example 17. The electronic circuit of any combination of examples 1 to 16, wherein the first semiconductor body is mounted on a first carrier and the second semiconductor body is mounted on a second carrier that is electrically insulated from the first carrier.

Example 18. The electronic circuit of any combination of examples 1 to 17, wherein the first semiconductor body and the second semiconductor body are mounted on the same carrier.

While the invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. An electronic circuit, comprising:
a first transistor device integrated in an inner region of a first semiconductor body;
a level shifter integrated in a level shifter region of the first semiconductor body, wherein the level shifter region is located in an edge region surrounding the inner region of the semiconductor body; and
a drive circuit integrated in a drive circuit region in the edge region of the first semiconductor body, wherein the drive circuit is configured to receive a first input signal from a first input and drive the first transistor device based on the first input signal, and wherein the drive circuit region is arranged closer to the inner region than the level shifter region.

2. The electronic circuit of claim 1, further comprising:
an input circuit integrated in the drive circuit region and coupled between a second input and the level shifter.

3. The electronic circuit of claim 1, wherein the drive circuit comprises at least one inverter.

4. The electronic circuit of claim 1, wherein the first transistor device comprises a plurality of transistor cells, each comprising:
a drift region of a first doping type;
a source region of the first doping type connected to a source node;
a body region of a second doping type complementary to the first doping type;
a drain region of the first doping type separated from the body region by the drift region and connected to a drain node; and
a gate electrode adjacent the body region and dielectrically insulated from the body region by a gate dielectric.

5. The electronic circuit of claim 4, wherein each of the plurality of transistor cells further comprises:
a compensation region adjoining the drift region.

6. The electronic circuit of claim 4, further comprising:
a first region of the first doping type and a second region of the second doping type in the edge region,
wherein a pn-junction is formed between the first region and the second region,
wherein the first region is connected to the drain node and the second region is connected to the source node, and
wherein the level shifter region is embedded in the second region.

7. The electronic circuit of claim 6, wherein the drive circuit region is embedded in the second region.

8. The electronic circuit of claim 7, wherein the drive circuit comprises at least one inverter.

9. The electronic circuit of claim 6, wherein a maximum doping concentration of the first region is higher than a maximum doping concentration of the drift region.

10. The electronic circuit of claim 6, wherein a maximum doping concentration of the second region is less than a maximum doping concentration of the drift region.

11. The electronic circuit of claim 6, wherein a maximum doping concentration of the second region is less than 1E16 cm$^{-3}$.

12. The electronic circuit of claim 1, wherein the level shifter comprises at least one lateral transistor device.

13. The electronic circuit of claim 1, further comprising:
a second transistor device,
wherein a load path of the second transistor device is connected in series with a load path of the first transistor device.

14. The electronic circuit of claim 13, wherein the second transistor device is integrated in a second semiconductor body.

15. The electronic circuit of claim 14, wherein the first semiconductor body and the second semiconductor body are arranged in a common housing.

16. The electronic circuit of claim 15, wherein the first semiconductor body is mounted on a first carrier and the second semiconductor body is mounted on a second carrier that is electrically insulated from the first carrier.

17. The electronic circuit of claim 15, wherein the first semiconductor body and the second semiconductor body are mounted on the same carrier.

18. An electronic circuit, comprising:
a first transistor device integrated in an inner region of a first semiconductor body; and
a level shifter and a drive circuit integrated in an edge region surrounding the inner region of the semiconductor body,
wherein the drive circuit is configured to receive a first input signal from a first input and drive the first transistor device based on the first input signal,
wherein the drive circuit is arranged closer to the inner region than the level shifter,
wherein the first transistor device comprises a plurality of transistor cells, each comprising:
a drift region of a first doping type;
a source region of the first doping type connected to a source node;
a body region of a second doping type complementary to the first doping type;
a drain region of the first doping type separated from the body region by the drift region and connected to a drain node; and
a gate electrode adjacent the body region and dielectrically insulated from the body region by a gate dielectric.

19. The electronic circuit of claim 18, wherein each of the plurality of transistor cells further comprises:
a compensation region adjoining the drift region.

20. The electronic circuit of claim 18, further comprising:
a first region of the first doping type and a second region of the second doping type in the edge region,
wherein a pn-junction is formed between the first region and the second region,
wherein the first region is connected to the drain node and the second region is connected to the source node, and
wherein the level shifter is embedded in the second region.

21. The electronic circuit of claim 20, wherein the drive circuit region is embedded in the second region.

22. The electronic circuit of claim 21, wherein the drive circuit comprises at least one inverter.

23. The electronic circuit of claim 20, wherein a maximum doping concentration of the first region is higher than a maximum doping concentration of the drift region.

24. The electronic circuit of claim 20, wherein a maximum doping concentration of the second region is less than a maximum doping concentration of the drift region.

25. The electronic circuit of claim 20, wherein a maximum doping concentration of the second region is less than 1E16 cm$^{-3}$.

* * * * *